(12) United States Patent
Chen et al.

(10) Patent No.: US 10,834,344 B2
(45) Date of Patent: Nov. 10, 2020

(54) DIGITAL PIXEL WITH EXTENDED DYNAMIC RANGE

(71) Applicant: Facebook Technologies, LLC, Menlo Park, CA (US)

(72) Inventors: Song Chen, Redmond, WA (US); Xinqiao Liu, Medina, WA (US); Andrew Samuel Berkovich, Redmond, WA (US); Wei Gao, Bothell, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/431,693

(22) Filed: Jun. 4, 2019

(65) Prior Publication Data
US 2019/0379846 A1 Dec. 12, 2019

Related U.S. Application Data

(60) Provisional application No. 62/682,874, filed on Jun. 9, 2018.

(51) Int. Cl.
*H04N 5/355* (2011.01)
*H01L 27/148* (2006.01)
(Continued)

(52) U.S. Cl.
CPC ..... *H04N 5/3559* (2013.01); *H01L 27/14812* (2013.01); *H04N 5/357* (2013.01); *H04N 5/37455* (2013.01)

(58) Field of Classification Search
CPC .. H04N 5/3559; H04N 5/357; H04N 5/37455; H04N 5/35509; H01L 27/14812; G06T 19/006
(Continued)

(56) References Cited

U.S. PATENT DOCUMENTS 4,596,977 A * 6/1986 Bauman .............. H03M 1/1095
341/167
6,529,241 B1 3/2003 Clark
(Continued)

FOREIGN PATENT DOCUMENTS

EP 1732134 12/2006
EP 1746820 1/2007
(Continued)

OTHER PUBLICATIONS

U.S. Appl. No. 16/436,049, "Non-Final Office Action", dated Mar. 4, 2020, 9 pages.
(Continued)

*Primary Examiner* — Brian K Young
(74) *Attorney, Agent, or Firm* — Kilpatrick Townsend & Stockton LLP

(57) ABSTRACT

In one example, an apparatus comprises: a comparator; a sampling capacitor having a first plate and a second plate. The first plate is coupled with an output of a charge sensing unit that senses charge generated by a photodiode, whereas the second plate is coupled with an input of the comparator. The apparatus further includes a controller configured to: at a first time, set a first voltage across the sampling capacitor based on an output voltage of the charge sensing unit; reset the charge sensing unit to set the first plate at a second voltage and to set the second plate at a third voltage based on the first voltage and the second voltage; compare, using the comparator, the third voltage against one or more thresholds; and generate, based on the comparison result, a quantization result of the output voltage of the charge sensing unit at the first time.

20 Claims, 18 Drawing Sheets

(51) Int. Cl.
*H04N 5/3745* (2011.01)
*H04N 5/357* (2011.01)

(58) Field of Classification Search
USPC .................................................. 341/155, 165
See application file for complete search history.

(56) References Cited

U.S. PATENT DOCUMENTS

| | | | | |
|---|---|---|---|---|
| 8,754,798 | B2* | 6/2014 | Lin | ............ H03M 1/38 |
| | | | | 341/118 |
| 9,967,496 | B2* | 5/2018 | Ayers | ............ H04N 5/37452 |
| 2008/0226183 | A1 | 9/2008 | Lei et al. | |
| 2009/0224139 | A1 | 9/2009 | Buettgen et al. | |
| 2009/0261235 | A1 | 10/2009 | Lahav et al. | |
| 2013/0234029 | A1 | 9/2013 | Bikumandla | |
| 2014/0306276 | A1 | 10/2014 | Yamaguchi | |
| 2015/0189209 | A1 | 7/2015 | Yang et al. | |
| 2016/0337605 | A1 | 11/2016 | Ito | |
| 2018/0152650 | A1 | 5/2018 | Sakakibara et al. | |
| 2019/0348460 | A1 | 11/2019 | Chen et al. | |
| 2019/0379827 | A1 | 12/2019 | Berkovich et al. | |
| 2020/0007800 | A1 | 1/2020 | Berkovich et al. | |
| 2020/0068189 | A1 | 2/2020 | Chen et al. | |

FOREIGN PATENT DOCUMENTS

| | | |
|---|---|---|
| EP | 2538664 | 12/2012 |
| EP | 2833619 | 2/2015 |
| EP | 3425352 | 1/2019 |
| KR | 20110050351 | 5/2011 |
| WO | 2017058488 | 4/2017 |
| WO | 2017069706 | 4/2017 |
| WO | 2017169882 | 10/2017 |
| WO | 2019168929 | 9/2019 |

OTHER PUBLICATIONS

U.S. Appl. No. 16/454,787, Notice of Allowance dated Apr. 22, 2020, 10 pages.
Cho et al., Low Power Dual CDS for a Column-Parallel CMOS Image Sensor, JSTS: Journal of Semiconductor Technology and Science, vol. 12, No. 4, Dec. 30, 2012, pp. 388-396.
Kavusi et al., Quantitative Study of High-Dynamic-Range Image Sensor Architectures, Proceedings of SPIE, the International Society for Optical Engineering, vol. 5301, Jun. 7, 2004, pp. 264-275.
International Application No. PCT/US2019/035724, International Search Report and Written Opinion dated Sep. 10, 2019, 12 pages.
International Application No. PCT/US2019/036484, International Search Report and Written Opinion dated Sep. 19, 2019, 10 pages.
International Application No. PCT/US2019/036492, International Search Report and Written Opinion dated Sep. 25, 2019, 9 pages.
International Application No. PCT/US2019/036536, International Search Report and Written Opinion dated Sep. 26, 2019, 14 pages.
International Application No. PCT/US2019/039410, International Search Report and Written Opinion dated Sep. 30, 2019, 11 pages.
International Application No. PCT/US2019/039758, International Search Report and Written Opinion dated Oct. 11, 2019, 13 pages.
International Application No. PCT/US2019/047156, International Search Report and Written Opinion dated Oct. 23, 2019, 9 pages.
International Application No. PCT/US2019/048241, International Search Report and Written Opinion dated Jan. 28, 2020, 16 pages.
Snoeij, A Low Power Column-Parallel 12-Bit ADC for CMOS Imagers, Proceedings IEEE Workshop on Charge—Coupled Devices Andadvanced Image Sensors (CCDS & AIS), IEEE, Jun. 1, 2005, pp. 169-172.

* cited by examiner

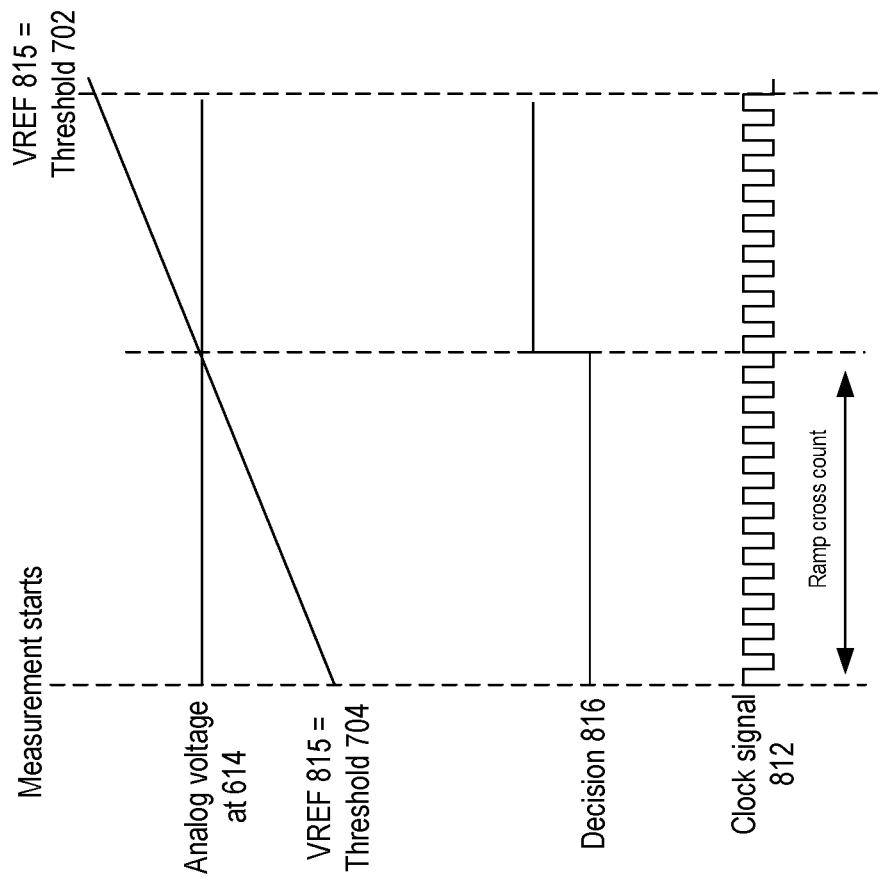
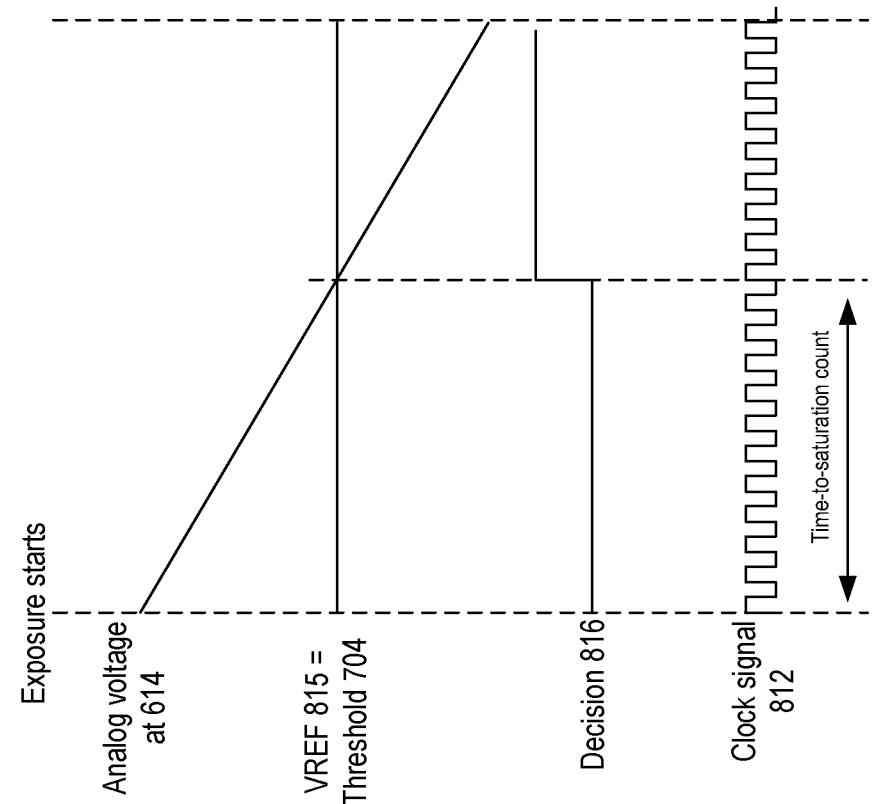
FIG. 9B
FIG. 9A

DIGITAL PIXEL WITH EXTENDED DYNAMIC RANGE

RELATED APPLICATION

This patent application claims priority to U.S. Provisional Patent Application Ser. No. 62/682,874, filed Jun. 9, 2018, entitled "SYSTEM AND METHOD FOR REDUCING SAMPLING NOISE IN IMAGE SENSOR," which is assigned to the assignee hereof and is incorporated herein by reference in its entirety for all purposes.

BACKGROUND

The disclosure relates generally to image sensors, and more specifically to pixel cell structure including interfacing circuitries for determining light intensity for image generation.

A typical image sensor includes a photodiode to sense incident light by converting photons into charge (e.g., electrons or holes). The image sensor further includes a floating node configured as a capacitor to collect the charge generated by the photodiode during an exposure period. The collected charge can develop a voltage at the capacitor. The voltage can be buffered and fed to an analog-to-digital converter (ADC), which can quantize the voltage into a digital value representing the intensity of the incident light. The accuracy of the quantization, however, can be affected by various noise sources, such as thermal noise, comparator offset, etc.

SUMMARY

The present disclosure relates to image sensors. More specifically, and without limitation, this disclosure relates to a pixel cell. This disclosure also relates to operating the circuitries of pixel cells to generate a digital representation of the intensity of incident light.

In one example, an apparatus is provided. The apparatus includes a photodiode to generate charge responsive to incident light within an integration period; a charge sensing unit to store at least some of the charge and to generate an output voltage based on a quantity of the charge generated by the photodiode within the integration period; and an analog-to-digital converter (ADC) comprising: a comparator; a sampling capacitor having a first plate coupled with an output of the charge sensing unit and a second plate coupled with an input of the comparator; and a controller configured to, after the integration period: set a first voltage across the sampling capacitor based on the output voltage of the charge sensing unit; reset the charge sensing unit to set the first plate at a second voltage and to set the second plate at a third voltage based on the first voltage and the second voltage; compare, using the comparator, the third voltage against one or more thresholds; and generate, based on the comparison result, a quantization result of the output voltage to represent an intensity of the incident light received by the photodiode within the integration period.

In some aspects, the controller is configured to set the first voltage based on electrically connecting the input of the comparator with an output of the comparator. The first voltage includes: a first component representing a quantity of the charge generated by the photodiode within the integration period, a second component representing an offset of the comparator, and a third component representing first reset noise charge introduced to the charge sensing unit in a reset operation prior to the resetting the charge sensing unit. The second voltage comprises a fourth component representing second reset noise charge introduced to the charge sensing unit by the resetting the charge sensing unit; and the third voltage includes a fifth component representing a combination of the third component and the fourth component.

In some aspects, the third voltage includes the second component representing an offset of the comparator to cancel the offset of the comparator when the third voltage is compared against the one or more thresholds by the comparator.

In some aspects, the one or more thresholds comprise a ramping threshold. The ramping threshold comprises a range of thresholds based on an expected quantity of dark current in the charge sensing unit.

In some aspects, the ADC further comprises a counter and a memory. The counter is configured to generate count values with respect to time. The memory is configured to, based on the comparison result, store a count value of the count values as the quantization result.

In some aspects, the photodiode is configured to store residual charge until the photodiode saturates and to transmit overflow charge when the photodiode saturates.

In some aspects, the ADC is configured to: determine, based on the comparison result, that the charge sensing unit stores the overflow charge from the photodiode within the integration period; and based on the determination, assert a flag bit to maintain the stored count value in the memory as the quantization result.

In some aspects, the quantization result is a first quantization result. The comparison result is a first comparison result. The ADC is configured to: obtain, using the sampling capacitor, a fourth voltage representing a quantity of overflow charge stored in the charge sensing unit during the integration period; compare, using the comparator, the fourth voltage against a fixed threshold of the one or more thresholds to generate a second comparison result; and generate, based on the second comparison result, a second quantization result of a duration for the fourth voltage to reach the fixed threshold to represent an intensity of the incident light received by the photodiode within the integration period.

In some aspects, the controller is configured to set the first voltage across the sampling capacitor and to reset the charge sensing unit to set the second plate at the third voltage based on the first voltage and the second voltage at the end of the integration period based on a duration of the integration period exceeding a duration threshold.

In some aspects, the photodiode, the charge sensing unit, and the ADC is part of a pixel cell. The quantization result corresponds to a pixel value.

In some examples, an analog-to-digital converter (ADC) is provided. The ADC comprises: a comparator; a sampling capacitor having a first plate coupled with an output of a charge sensing unit and a second plate being coupled with an input of the comparator; and a controller configured to: at a first time, set a first voltage across the sampling capacitor based on an output voltage of the charge sensing unit at the first time; reset the charge sensing unit to set the first plate at a second voltage and to set the second plate at a third voltage based on the first voltage and the second voltage; compare, using the comparator, the third voltage against one or more thresholds; and generate, based on the comparison result, a quantization result of the output voltage of the charge sensing unit at the first time.

In some aspects, the controller is configured to set the first voltage based on electrically connecting the input of the comparator with an output of the comparator. The first voltage includes: a first component representing a quantity of charge stored in the charge sensing unit, a second component representing an offset of the comparator, and a third component representing first reset noise charge introduced to the charge sensing unit in a reset operation prior to the resetting the charge sensing unit. The second voltage comprises a fourth component representing second reset noise charge introduced to the charge sensing unit by the resetting the charge sensing unit. The third voltage includes a fifth component representing a combination of the third component and the fourth component.

In some aspects, the third voltage includes the second component representing the offset of the comparator to cancel the offset of the comparator when the third voltage is compared against the one or more thresholds by the comparator.

In some aspects, the ADC further includes a counter and a memory. The counter is configured to generate count values with respect to time. The memory is configured to store, based on comparison result, a count value of the count values as the quantization result.

In some aspects, the one or more thresholds comprise a ramping threshold. The ramping threshold comprises a range of thresholds set based on an expected quantity of dark current in the charge sensing unit.

In some aspects, the charge sensing unit comprises a floating drain of a transistor configured to store charge.

In some aspects, a voltage across the sampling capacitor drifts prior to the setting of the first voltage.

In some examples, a method is provided. The method comprises: enabling a photodiode to generate charge responsive to incident light within an integration period; controlling a charge sensing unit to generate an output voltage based on a quantity of the charge generated by the photodiode within the integration period; after the integration period, and based on the output voltage of the charge sensing unit, setting a first voltage across a sampling capacitor, wherein a first plate of the sampling capacitor is coupled with an output of the charge sensing unit and a second plate of the sampling capacitor is coupled with an input an comparator; resetting the charge sensing unit to set the first plate at a second voltage and to set the second plate at a third voltage based on the first voltage and the second voltage; comparing, using the comparator, the third voltage against one or more thresholds; and generating, based on the comparison result, a quantization result of the output voltage to represent an intensity of the incident light received by the photodiode within the integration period.

In some aspects, the method further comprises electrically connecting the input of the comparator with an output of the comparator to set the first voltage across the sampling capacitor. The first voltage includes: a first component representing a quantity of charge stored in the charge sensing unit, a second component representing an offset of the comparator, and a third component representing first reset noise charge introduced to the charge sensing unit in a reset operation prior to the resetting the charge sensing unit. The second voltage comprises a fourth component representing second reset noise charge introduced to the charge sensing unit by the resetting the charge sensing unit. The third voltage includes a fifth component representing a combination of the third component and the fourth component.

In some aspects, the third voltage includes the second component representing the offset of the comparator to cancel the offset of the comparator when the third voltage is compared against the one or more thresholds by the comparator.

BRIEF DESCRIPTION OF THE DRAWINGS

Illustrative embodiments are described with reference to the following figures.

FIG. 9A and FIG. 9B illustrate example methods for determining a light intensity.

Figure 1A:
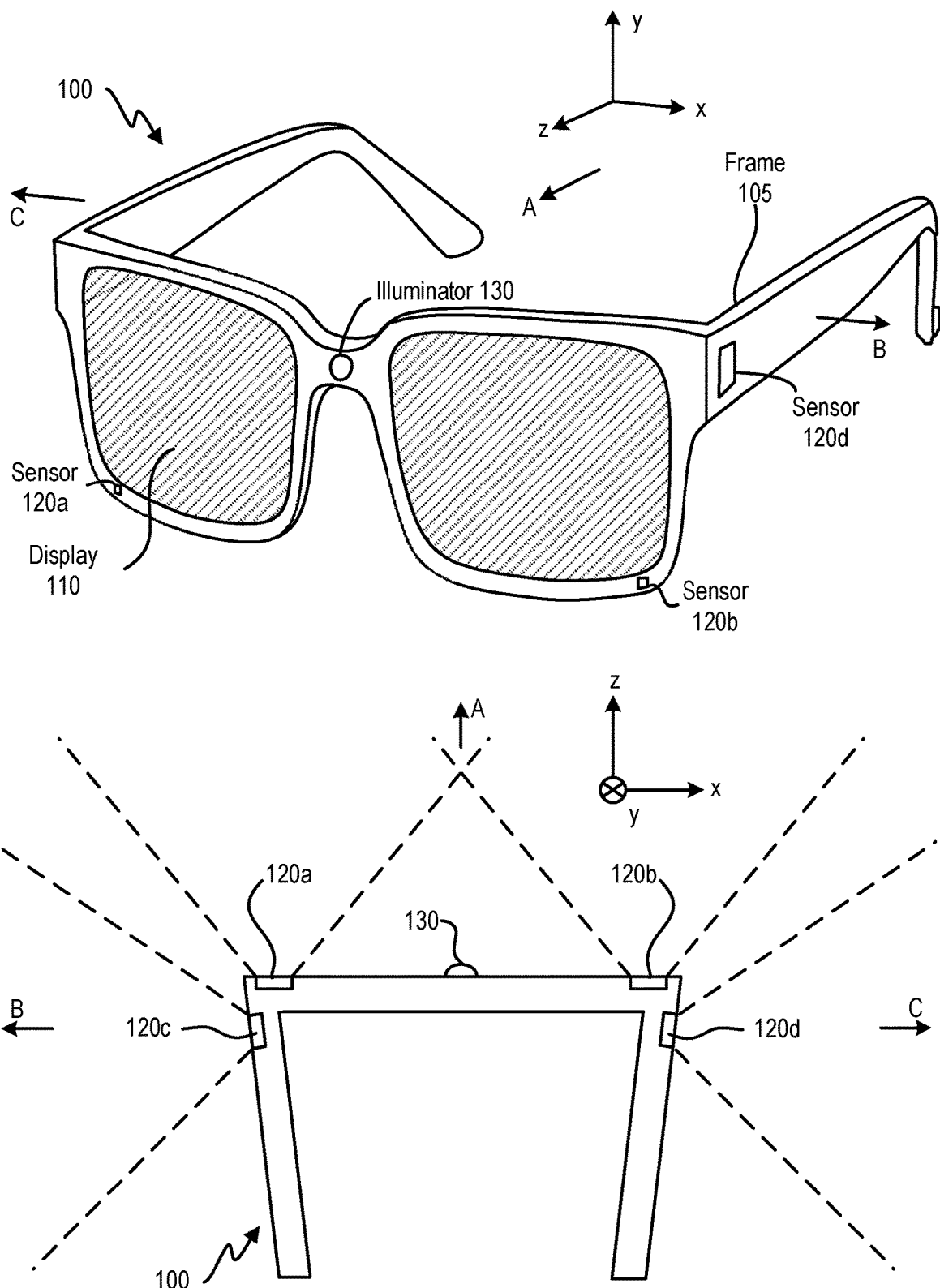
FIG. 1A and FIG. 1B are diagrams of an embodiment of a near-eye display.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor includes a photodiode to sense incident light by converting photons into charge (e.g., electrons or holes). The image sensor further includes a floating node configured as a capacitor to collect the charge generated by the photodiode during an exposure period. The collected charge can develop a voltage at the capacitor. The voltage can be buffered and fed to an analog-to-digital converter (ADC), which can convert the voltage into a digital value representing the intensity of the incident light.

The digital value generated by the ADC, which reflects a quantity of charge stored at the floating node within an exposure period, may correlate to the intensity of the incident light. However, the degree of correlation can be affected by different factors. First, the quantity of charge stored in the floating node can be directly related to the intensity of the incident light until the floating node reaches a saturation limit. Beyond the saturation limit, the floating node may be unable to accept additional charge generated by the photodiode, and the additional charge may be leaked and not stored. As a result, the quantity of the charge stored at the floating node may be lower than the quantity of charge actually generated by the photodiode. The saturation limit may determine an upper limit of the measurable light intensity of the image sensor.

Various factors can also set a lower limit of the measurable light intensity of the image sensor. For example, the charge collected at the floating node may include noise charge not related to the intensity of incident light. One source of noise charge can be dark current, which can be leakage currents generated at the p-n junction of the photodiode and at the p-n junctions of other semiconductor devices connected to the capacitor, due to crystallographic defects. The dark currents can flow into the capacitor and add charges which are not correlated to the intensity of the incident light. The dark current generated at the photodiode is typically less than the dark current generated at other semiconductor devices. Another source of noise charge can be capacitive coupling with other circuitries. For example, when the ADC circuitries perform read operations to determine the quantity of charge stored in the floating node, the ADC circuitries can introduce noise charge into the floating node through capacitive coupling.

Besides noise charge, the ADC can also introduce measurement errors in determining the quantity of charge. The measurement errors can degrade the degree of correlation between the digital output and the intensity of the incident light. One source of measurement error is quantization error. In a quantization process, a discrete set of quantity levels can be used to represent a continuous set of quantities of charge, with each quantity level representing a pre-determined quantity of charge. The ADC can compare an input quantity of charge against the quantity levels, determine the quantity level that is closest to the input quantity, and output the determined quantity level (e.g., in the form of digital codes representing the quantity level). Quantization error can occur when there is a mismatch between a quantity of charge represented by the quantity level and the input quantity of charge mapped to the quantity level. The quantization error can be reduced with smaller quantization step sizes (e.g., by reducing the difference in charge quantities between two adjacent quantity levels). Other sources of measurement error may also include, for example, device noises (e.g., of the ADC circuitries) For example, during the reset of the floating node between measurements, thermal noise (as well as other noises, such as 1/f noise, etc.) can be injected into the floating node as reset noise, which adds charge not reflecting the incident light intensity to the floating node. Moreover, the comparator offset can also lead to errors in the comparisons between the input quantity of charge and the quantity levels. The noise charge (e.g., dark current) and the ADC measurement errors can define a lower limit of the measurable light intensity of the image sensor, whereas the saturation limit may determine an upper limit of the measurable light intensity of the image sensor. A ratio between the upper limit and the lower limit defines a dynamic range, which may set a range of operational light intensities for the image sensor.

The effects of reset noise and comparator offset can be mitigated using various techniques, such as correlated double sampling (CDS). With correlated double sampling, a sampling capacitor can be used to sample the floating node voltage twice. The first sampling operation can be performed when the floating node and the comparator are in a reset state. From the first sampling operation, the sampling capacitor can store charge representing the reset noise and comparator offset to generate a first measurement. The second sampling operation can be performed when the floating node and the comparator are out of the reset state to sense incident light, and a second measurement can be obtained. The second measurement includes a measurement of the incident light intensity as well as the same reset noise and comparator offset. The first measurement can be subtracted from the second measurement to generate a compensated measurement, in which the reset noise is eliminated or substantially reduced. Meanwhile, the comparator offset component remains in the compensated measurement. As the compensated measurement is compared with a threshold by the comparator to perform the quantization, the comparator offset component in the compensated measurement can eliminate or substantially reduce the comparator offset introduced by the comparator.

Although correlated double sampling can mitigate the effect of reset noise and comparator offset, various factors can reduce the effectiveness of correlated double sampling. One factor can be charge leakage from the sampling capacitor. If the first measurement and the second measurement are separated by a long duration, a substantial portion of noise charge representing the reset noise and the comparator offset may have been leaked from the sampling capacitor by the time when the second measurement is made. As a result, the first measurement may not include accurate representations of the reset noise and/or the comparator offset by the time when the first measurement is subtracted from the second measurement, and the mitigation of reset noise and comparator offset becomes much less effective. Therefore, a shorter time gap between the first sampling operation and the second sampling operation may be needed for the correlated double sampling scheme to be effective.

However, imposing a limit on the time gap between the first measurement and the second measurement may be undesirable, since such a limit can restrict the light sensing operation of the pixel cell. Specifically, a pixel cell may be configured to sense incident light within an integration period in which the floating node can accumulate charge transferred from the photodiode. The floating node can be reset prior to the integration period. To perform correlated double sampling, the sampling capacitor can be operated to measure the floating node voltage in the reset state, as part of the first sampling operation, to obtain the first measurement. The floating node is then out of the reset state and can accumulate charge from the photodiode during the integration period. The sampling capacitor can be operated, as part of the second sampling operation, to sample the floating node voltage at the end of the integration period to obtain the second measurement. As the integration period may be set to be relatively long to ensure the floating node can accumulate a sufficient quantity of charge measurable by the ADC when operating in a low light environment, substantial charge leakage from the sampling capacitor may result during the integration period. Meanwhile, reducing the integration period may be undesirable if the pixel cell operates in a low light environment. Reducing the integration period may raise the lower limit of the measurable light intensity of the image sensor and reduce the dynamic range, and the performance of the pixel cell is degraded. Such a pixel cell may be unsuitable for applications such as a wearable virtual reality (VR)/augmented reality (AR)/mixed reality (MR) system that operate in environments with a very wide range of light intensities.

This disclosure relates to a pixel cell that can provide extended dynamic range by addressing some of the issues discussed above. The pixel cell includes a photodiode configured to generate and store charge responsive to incident light, and a charge storage unit (e.g., a floating node) configured to accumulate charge from the photodiode in an integration period. The pixel cell further includes an analog-to-digital converter (ADC). The ADC includes a sampling capacitor and a comparator and can be controlled by a controller that can be part of the ADC. At the end of the integration period, the controller can reset the comparator. A first sampling operation can be performed, in which the sampling capacitor can store a first voltage based on charge stored in the charge storage unit and an offset voltage of the comparator. The charge stored in the charge storage unit also includes a first reset noise charge from a prior reset operation of the charge storage unit before the integration period. After the first sampling operation, the controller can enable the comparator and reset the charge storage unit to perform a second sampling operation. As part of the second sampling operation, the sampling capacitor can receive a second voltage related to the second reset noise charge introduced by the resetting of the charge storage unit. The sampling capacitor can output a third voltage based on a combination of the first voltage and the second voltage. The third voltage can include a first component representing a quantity of charge transferred from the photodiode to the sampling capacitor within the integration period, a second component representing the offset voltage, and a third component representing a difference between the first reset noise charge and the second noise charge. The comparator can compare the difference against a threshold to generate a digital output to represent an intensity of the incident light received by the photodiode within the integration period.

Specifically, the sampling capacitor can be configured as an ac-coupled capacitor. The left plate of the sampling capacitor can be coupled with the charge storage unit, whereas the right plate of the sampling capacitor can be coupled with the comparator. As part of the first sampling operation, the comparator can be reset. A voltage of the left plate of the sampling capacitor can be set based on the charge stored in the charge storage unit including the first reset noise charge. A voltage of the right plate of the sampling capacitor can be set based on the offset voltage of the comparator. A voltage difference between the left plate and the right plate of the sampling capacitor can be stored in the sampling capacitor as the first voltage.

The second sampling operation can start after the first sampling operation completes and the first voltage is stored in the sampling capacitor. As part of the second sampling operation, the charge storage unit can be reset, whereas the comparator can be enabled. The resetting of the charge storage unit can set the left plate of the sampling capacitor to the second voltage, which contains information about the second reset noise. As the voltage difference (first voltage) across the sampling capacitor remains, via ac-coupling the right plate of the sampling capacitor can develop the third voltage based on combining the first voltage and the second voltage. The combination can lead to at least partial cancellation between the first reset noise charge and the second noise charge in the third voltage, while the comparator offset component remains. The third voltage can be compared against a threshold by the comparator (e.g., by comparing against a threshold) having the comparator offset. The effect of comparator offset can be cancelled or substantially mitigated by the comparator offset component contained in the third voltage.

With the disclosed techniques, the two sampling operations (for measuring reset noise and comparator offset, and for measuring the charge from the photodiode) can be obtained after the integration period. The two sampling operations can be separated by a relatively short period. As a result, the effect of noise charge leakage of the sampling capacitor can be reduced, while the integration period needs not be restricted to reduce the charge leakage effect. The disclosed techniques enable effective mitigation of reset noise and comparator offset even when an extended integration period is provided to measure low light intensity, which can reduce the lower limit of measurable light intensity and extend the dynamic range.

The disclosed techniques can also add operation flexibility to the pixel cell. For example, the pixel cell can have an adaptive integration period, where the integration period can be increased when the pixel cell operates in an environment with low light intensity, and where the integration period can be reduced when the pixel cell operates in an environment with high or medium light intensity. With a reduced integration period, the pixel cell can be controlled to perform correlated double sampling operation (e.g., where the two sampling operations are separated by the integration period) for enhanced measurement error compensation. With an increased integration period, the pixel cell can be controlled to perform measurements based on the disclosed techniques (e.g., where the two sampling operations are performed after the integration period). By extending the dynamic range of the pixel cell, the disclosed techniques can also improve the performance of an application (e.g., a VR/AR/MR system) that relies on the digital output of the pixel cell, as well as improve user experience.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an embodiment of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel array configured to generate image data representing different fields of views along different directions. For example, sensors 120a and 120b may be configured to provide image data representing two fields of view towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such an arrangement, the accuracy and robustness of tracking a location of the user within the physical environment can be improved.

In some embodiments, near-eye display 100 may further include one or more active illuminators 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some embodiments, illuminator 130 may also enable stereoscopic imaging. For example, one or more of sensors 120a or 120b can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

Figure 1B:
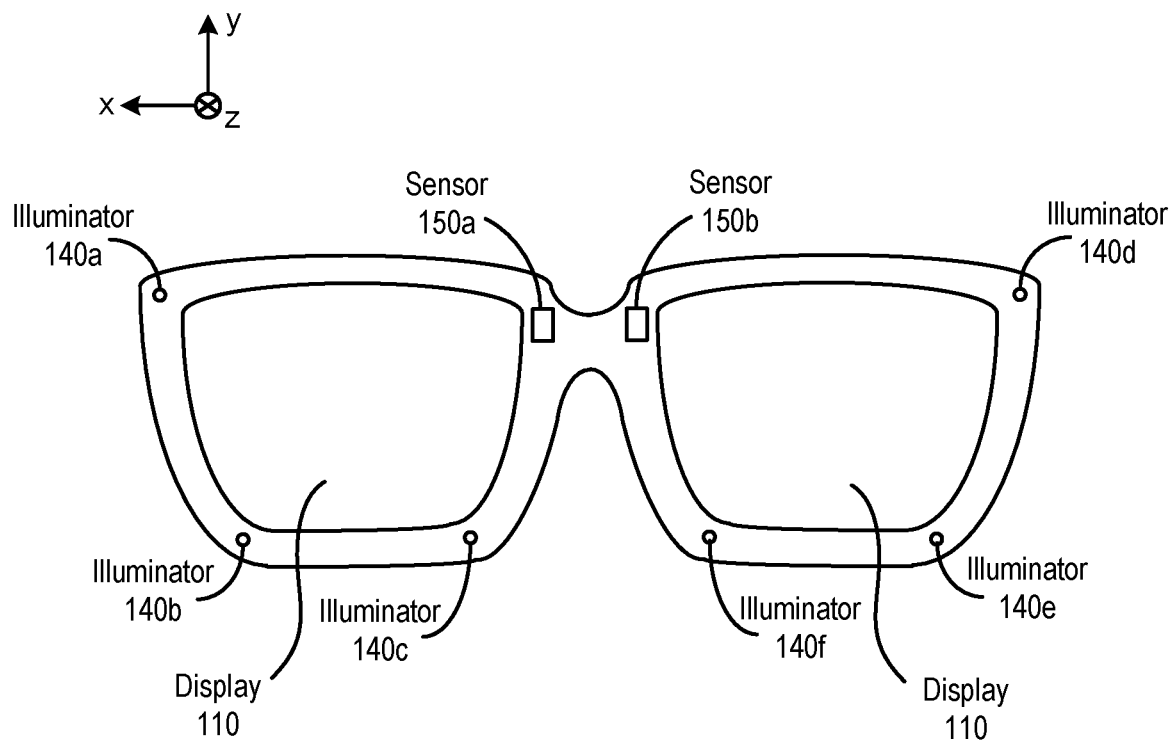

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern, and can be reflected by the left eyeball of the user. Sensor 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel array to generate an image of the reflected pattern. Based on the images of the reflected pattern from sensors 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b comprise the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 1B:
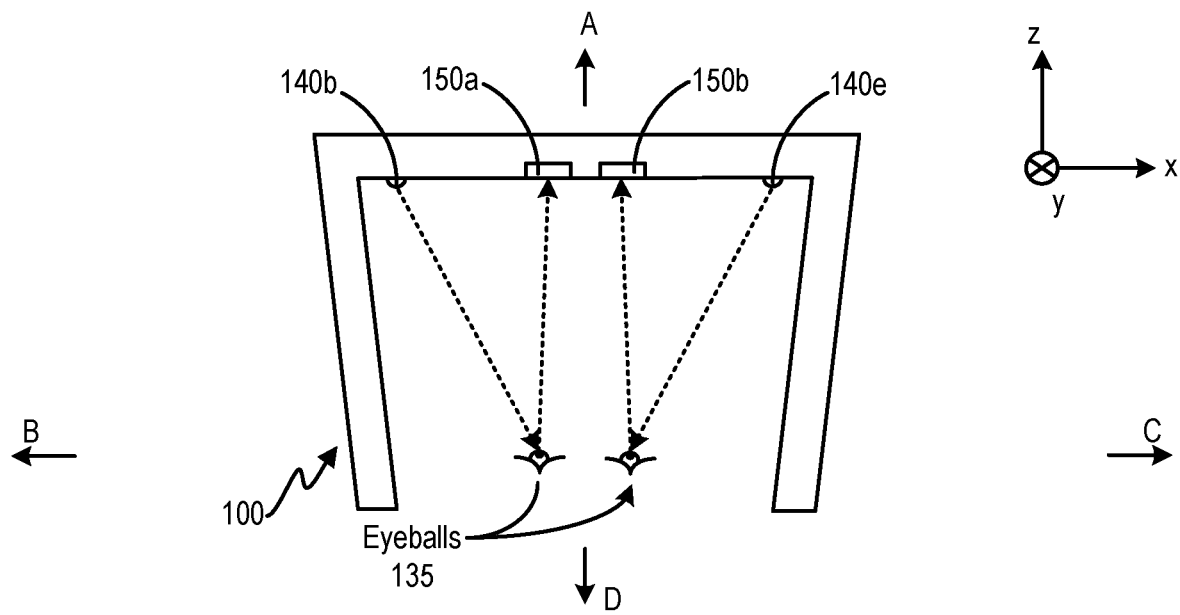
Figure 2:
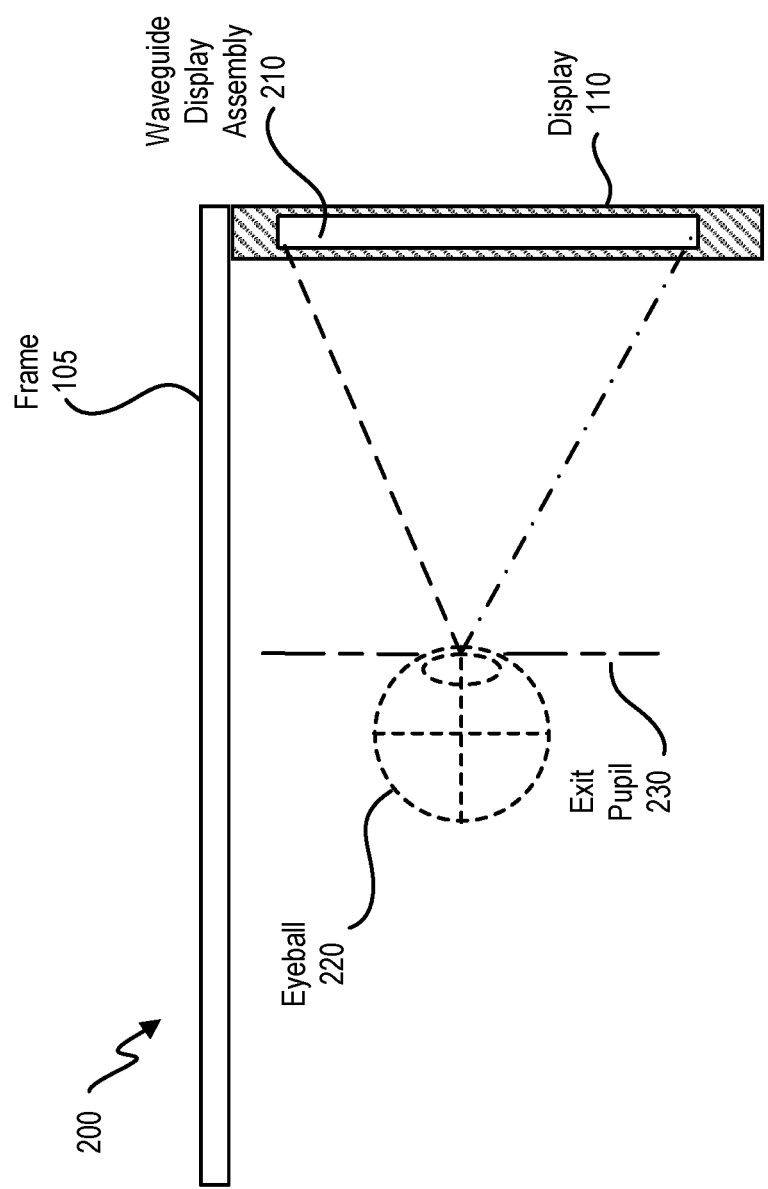
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
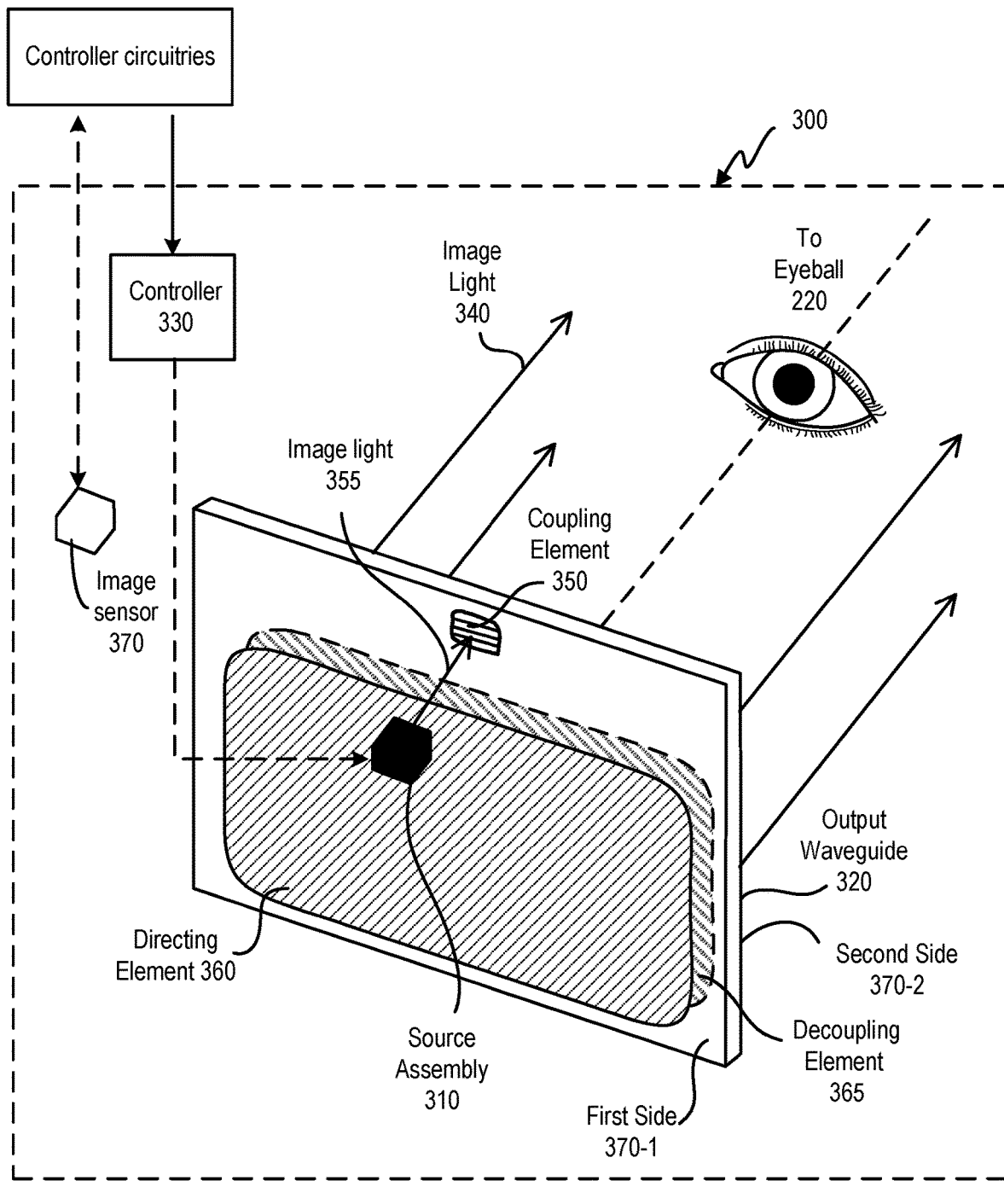
FIG. 3 illustrates an isometric view of an embodiment of a waveguide display with a single source assembly.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user, a gaze point of the user, etc., and determine the content of the images to be displayed to the user. The remote console can transmit instructions to controller 330 related to the determined content. Based on the instructions, controller 330 can control the generation and outputting of image light 355 by source assembly 310.

Figure 4:
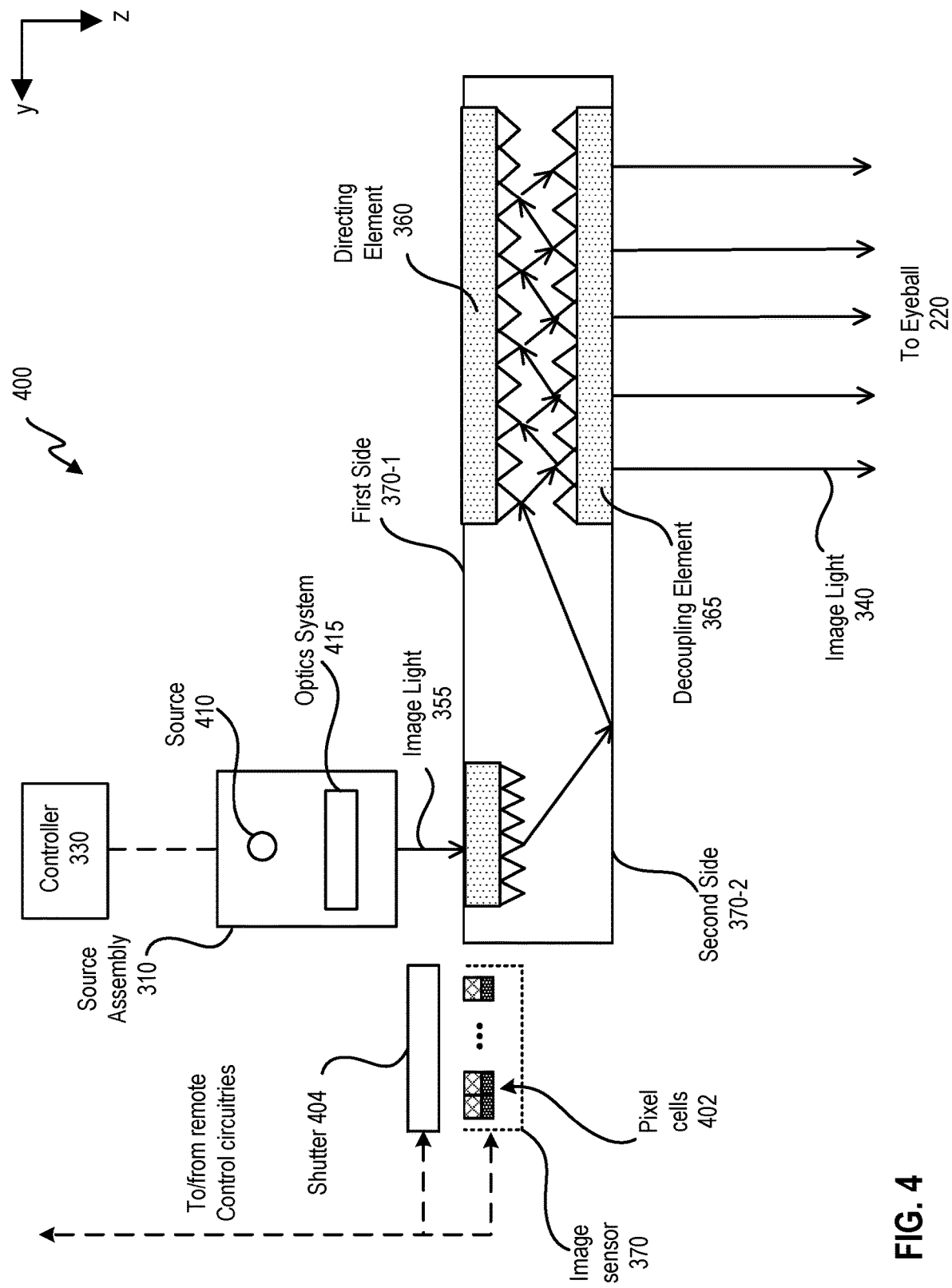
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 interposed between the set of pixel cells 402 and the physical environment to control the exposure of the set of pixel cells 402. In some embodiments, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
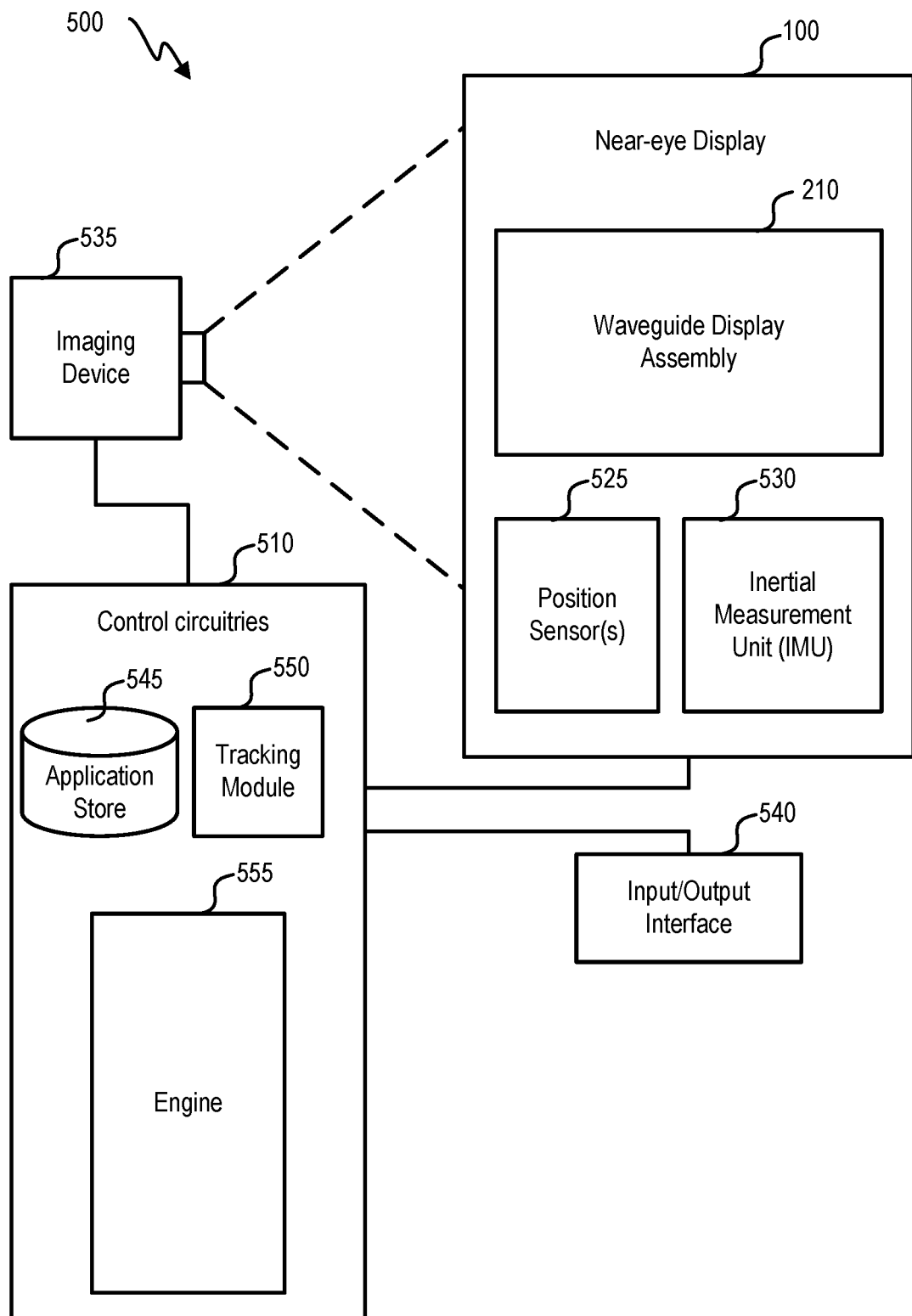
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located, for performing location tracking of the user. Imaging device 535 may further include, for example, image sensors 150a-150b of FIG. 1B for generating image data for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), or a gaze point of the user (e.g., based on image data provided by imaging device 535), a distance between an object and user (e.g., based on image data provided by imaging device 535).

Figure 6:
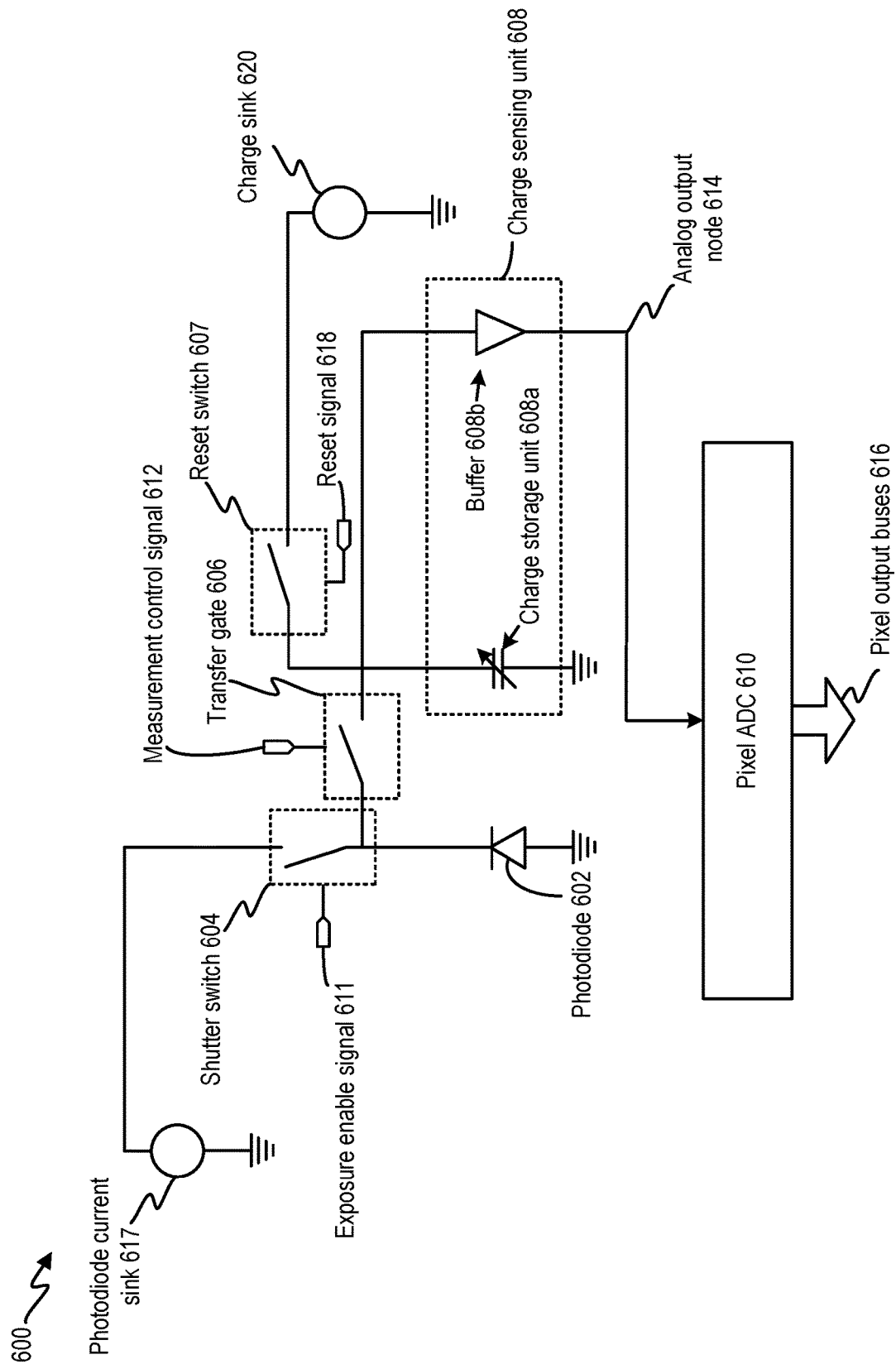
FIG. 6 illustrates block diagrams of embodiments of a pixel cell.

FIG. 6 illustrates an example of a pixel cell 600. Pixel cell 600 may be part of a pixel array and can generate digital intensity data corresponding to a pixel of an image. For example, pixel cell 600 may be part of pixel cells 402 of FIG. 4. As shown in FIG. 6, pixel cell 600 may include a photodiode 602, a shutter switch 604, a transfer gate 606, a reset switch 607, a charge sensing unit 608 including a charge storage unit 608a and a buffer 608b, and a pixel ADC 610.

In some embodiments, photodiode 602 may include, for example, a P-N diode, a P-I-N diode, a pinned diode, etc. Photodiode 602 can generate charge upon receiving light, and the quantity of charge generated can be proportional to the intensity of the light. Photodiode 602 can also store some of the generated charge until the photodiode saturates, which occurs when the well capacity of the photodiode is reached. Moreover, each of shutter switch 604, transfer gate 606, and reset switch 607 can include a transistor. The transistor may include, for example, a metal-oxide-semiconductor field-effect transistor (MOSFET), a bipolar junction transistor (BJT), etc. Shutter switch 604 can act as an electronic shutter gate (in lieu of, or in combination with, mechanical shutter 404 of FIG. 4) to control an exposure period of pixel cell 600. During the exposure period, shutter switch 604 can be disabled (turned off) by exposure enable signal 611, which allows photodiode 602 to store the generated charge and, when photodiode 602 saturates, allows the overflow charge to flow to charge storage unit 608a, which can accumulate the charge and convert the charge to an analog voltage. At the end of the exposure period, shutter switch 604 can be enabled to steer the charge generated by photodiode 602 into photodiode current sink 617. Moreover, reset switch 607 can also be disabled (turned off) by reset signal 618, which allows charge storage unit 608a to accumulate the charge. Charge storage unit 608a can be a device capacitor at a floating terminal of transfer gate 606, a metal capacitor, a MOS capacitor, or any combination thereof. Charge storage unit 608a can be used to measure/sense a quantity of charge by converting the quantity to voltage, which can be measured by pixel ADC 610 to provide a digital output representing the incident light intensity. After a mode of measurement completes, reset switch 607 can be enabled to empty the charge stored at charge storage unit 608a to charge sink 620, to make charge storage unit 608a available for the next measurement.

Figure 7:
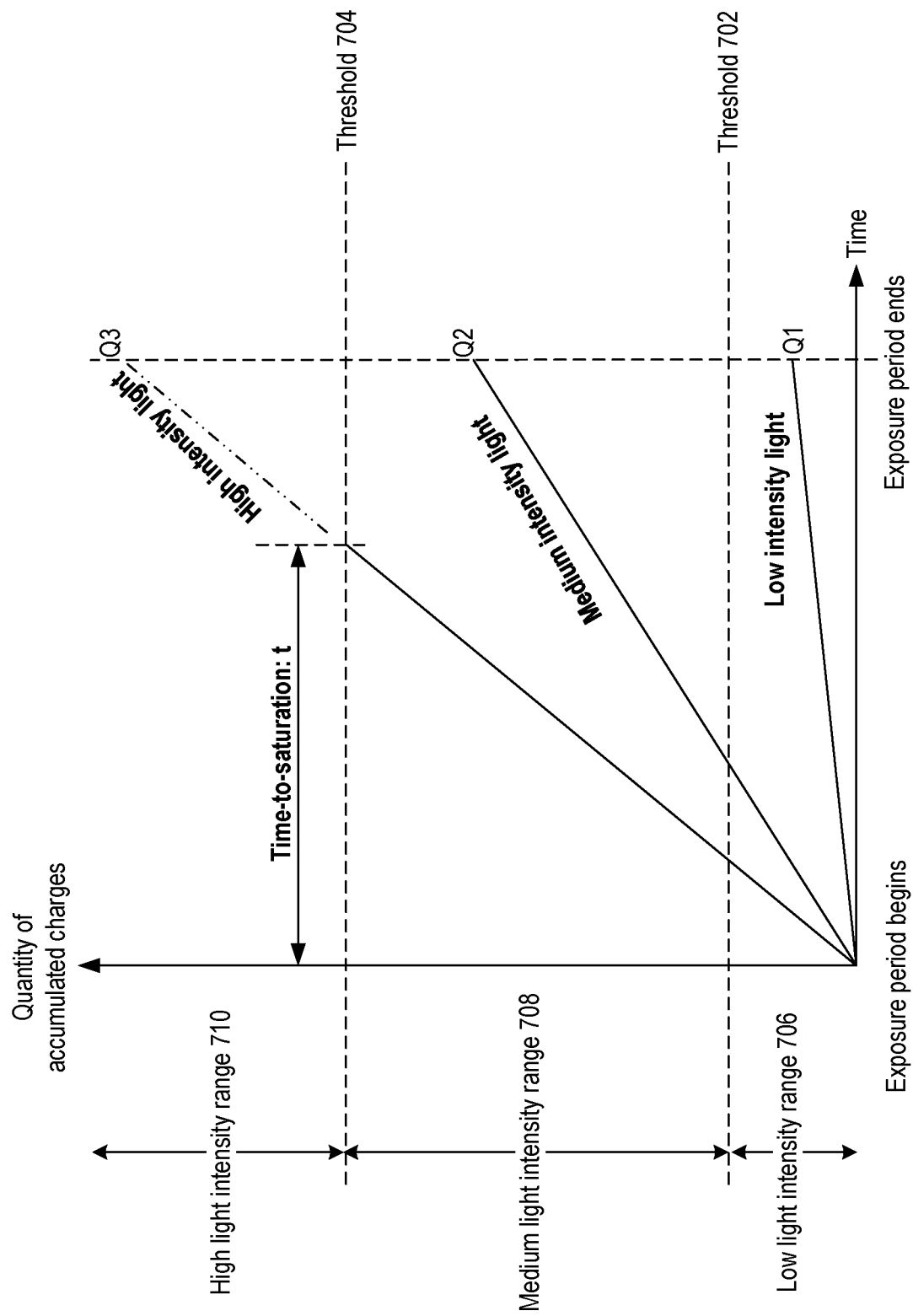
FIG. 7 illustrates operations for determining light intensities of different ranges by embodiments of FIG. 6.

Reference is now made to FIG. 7, which illustrates a quantity of charge accumulated with respect to time for different light intensity ranges. The total quantity of charge accumulated at a particular time point can reflect the intensity of light incident upon photodiode 602 during an exposure period. The quantity can be measured when the exposure period ends. A threshold 702 and a threshold 704 can be defined for a threshold's quantity of charge defining a low light intensity range 706, a medium light intensity range 708, and a high light intensity range 710 for the intensity of the incident light. For example, if the total accumulated charge is below threshold 702 (e.g., Q1), the incident light intensity is within low light intensity range 706. If the total accumulated charge is between threshold 704 and threshold 702 (e.g., Q2), the incident light intensity is within medium light intensity range 708. If the total accumulated charge is above threshold 704, the incident light intensity is within medium light intensity range 710. The quantity of the accumulated charge, for low and medium light intensity ranges, can correlate with the intensity of the incident light, if the photodiode does not saturate within the entire low light intensity range 706 and the measurement capacitor does not saturate within the entire medium light intensity range 708.

The definitions of low light intensity range 706 and medium light intensity range 708, as well as thresholds 702 and 704, can be based on the storage capacities of photodiode 602 and storage unit 608. For example, low light intensity range 706 can be defined such that the total quantity of charge stored in photodiode 602, at the end of the exposure period, is below or equal to the storage capacity of the photodiode, and threshold 702 can be based on the storage capacity of photodiode 602. As to be described below, threshold 702 can be set based on a scaled storage capacity of photodiode 602 to account for potential capacity variation of the photodiode. Such arrangements can ensure that, when the quantity of charge stored in photodiode 602 is measured for intensity determination, the photodiode does not saturate, and the measured quantity relates to the incident light intensity. Moreover, medium light intensity range 708 can be defined such that the total quantity of charge stored in storage unit 608, at the end of the exposure period, is below or equal to the storage capacity of the measurement capacitor, and threshold 704 can be based on the storage capacity of storage unit 608. Typically threshold 704 is also set to be based on a scaled storage capacity of charge storage unit 608a to ensure that when the quantity of charge stored in charge storage unit 608a is measured for intensity determination, the measurement capacitor does not saturate, and the measured quantity also relates to the incident light intensity. As to be described below, thresholds 702 and 704 can be used to detect whether photodiode 602 and charge storage unit 608a saturate, which can determine the intensity range of the incident light and the measurement result to be output.

In addition, in a case where the incident light intensity is within high light intensity range 710, the total overflow charge accumulated at charge storage unit 608a may exceed threshold 704 before the exposure period ends. As additional charge is accumulated, charge storage unit 608a may reach full capacity before the end of the exposure period, and charge leakage may occur. To avoid measurement error caused due to charge storage unit 608a reaching full capacity, a time-to-saturation measurement can be performed to measure the time duration it takes for the total overflow charge accumulated at charge storage unit 608a to reach threshold 704. A rate of charge accumulation at charge storage unit 608a can be determined based on a ratio between threshold 704 and the time-to-saturation, and a hypothetical quantity of charge (Q3) that could have been accumulated at charge storage unit 608a at the end of the exposure period (if the capacitor had limitless capacity) can be determined by extrapolation according to the rate of charge accumulation. The hypothetical quantity of charge (Q3) can provide a reasonably accurate representation of the incident light intensity within high light intensity range 710.

Referring back to FIG. 6, transfer gate 606 can be controlled by a measurement control signal 612 to control the charge accumulations at residual charge capacitor 603 and charge storage unit 608a for different light intensity ranges as described above. To measure high light intensity range 710 and medium light intensity range 708, transfer gate 606 can be controlled to operate in a partially turned-on state. For example, the gate voltage of transfer gate 606 can be set based on a voltage developed at photodiode 602 corresponding to the charge storage capacity of the photodiode. With such arrangements, only overflow charge (e.g., charge generated by the photodiode after the photodiode saturates) will transfer through transfer gate 606 to reach storage unit 608, to measure time-to-saturation (for high light intensity range 710) and the quantity of charge stored in charge storage unit 608a (for medium light intensity range 708). Moreover, to measure low light intensity range 706, transfer gate 606 can be controlled in a fully turned-on state to transfer the charge stored in photodiode 602 to storage unit 608, to measure the quantity of the charge stored in photodiode 602.

The charge accumulated at storage unit 608a can develop an analog voltage, which can buffered by buffer 608b to generate a replica of the analog voltage (but with larger driving strength) at analog output node 614. The analog voltage at analog output node 614 can be converted into a set of digital data (e.g., comprising logical ones and zeros) by pixel ADC 610. The analog voltage developed at charge storage unit 608a can be sampled and digital output can be generated before the end of the exposure period (e.g., for medium light intensity range 708 and high light intensity range 710), or after the exposure period (for low light intensity range 706). The digital data can be transmitted by a set of pixel output buses 616 to, for example, control circuitries 510 of FIG. 5, to represent the light intensity during the exposure period.

In some examples, the capacitance of charge storage unit 608a can be configurable to improve the accuracy of light intensity determination for a low light intensity range. For example, the capacitance of charge storage unit 608a can be reduced when charge storage unit 608a is used to measure the residual charge stored at residual charge capacitor 603. The reduction in the capacitance of charge storage unit 608a can increase the charge-to-voltage conversion ratio at storage unit 608, such that a higher voltage can be developed for a certain quantity of stored charge. The higher charge-to-voltage conversion ratio can reduce the effect of measurement errors (e.g., quantization error, comparator offset, etc.) introduced by pixel ADC 610 on the accuracy of low light intensity determination. The measurement error can set a limit on a minimum voltage difference that can be detected and/or differentiated by pixel ADC 610. By increasing the charge-to-voltage conversion ratio, the quantity of charge corresponding to the minimum voltage difference can be reduced, which in turn reduces the lower limit of a measurable light intensity by pixel cell 600 and extends the dynamic range. On the other hand, for medium light intensity, the capacitance of charge storage unit 608a can be increased to ensure that the charge storage unit 608a has sufficient capacity to store a quantity of charge up to, for example, the quantity defined by threshold 704.

Figure 8:
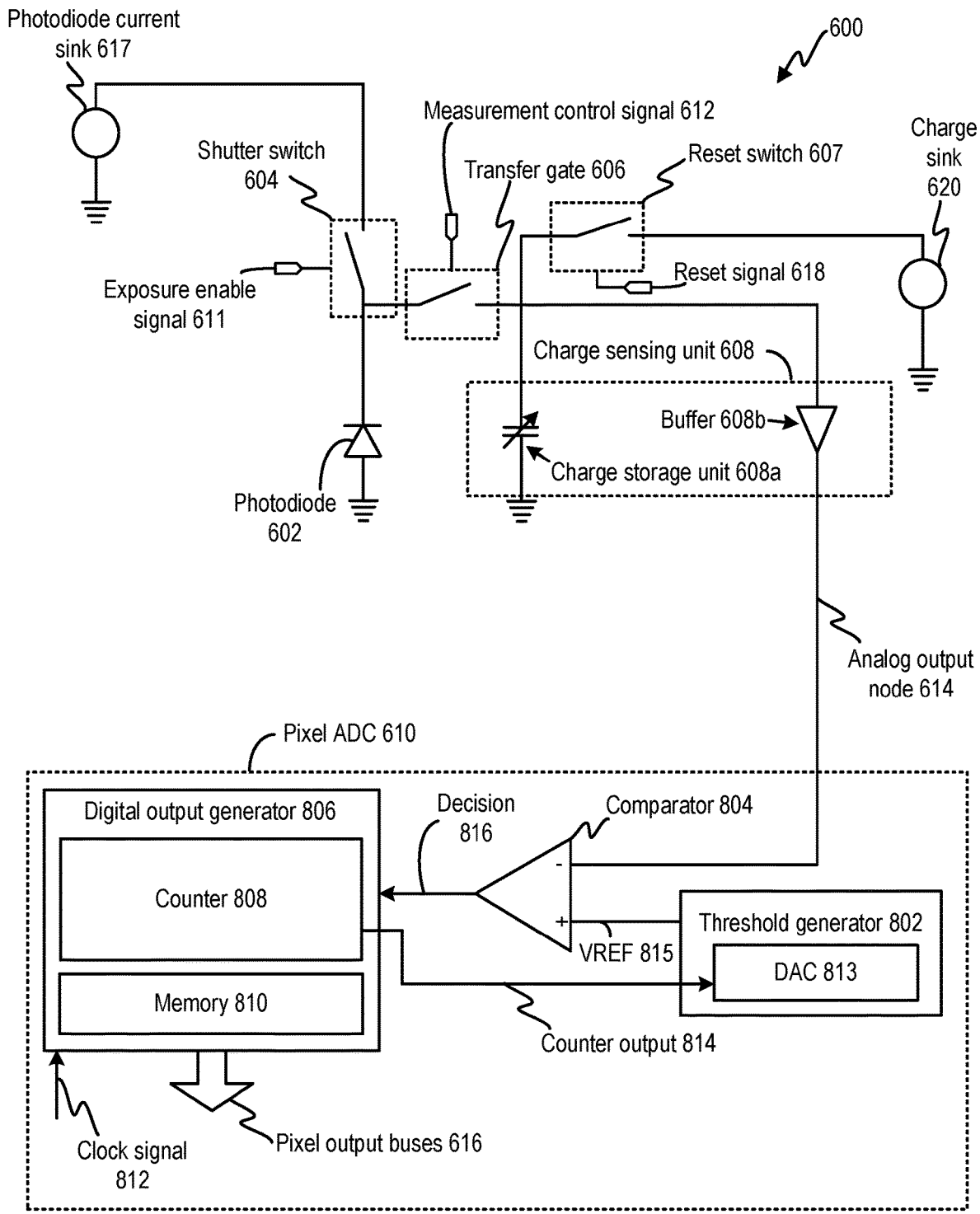
FIG. 8 illustrates examples of internal components of the pixel cell of FIG. 6.

FIG. 8 illustrates an example of the internal components of pixel ADC 610. As shown in FIG. 8, pixel ADC 610 includes a threshold generator 802, a comparator 804, and a digital output generator 806. Digital output generator 806 may further include a counter 808 and a memory device 810. Counter 808 can generate a set of count values based on a free-running clock signal 812, whereas memory 810 can store at least some of the count values (e.g., the latest count value) generated by counter 808. In some embodiments, memory 810 may be part of counter 808. Memory 810 can be, for example, a latch circuit to store the counter value based on local pixel value as described below. Threshold generator 802 includes a digital-to-analog converter (DAC) 813 which can accept a set of digital values and output a reference voltage (VREF) 815 representing the set of digital values. As to be discussed in more detail below, threshold generator 802 may accept static digital values to generate a fixed threshold, or accept output 814 of counter 808 to generate a ramping threshold.

Although FIG. 8 illustrates that DAC 813 (and threshold generator 802) is part of pixel ADC 610, it is understood that DAC 813 (and threshold generator 802) can be coupled with multiple digital output generators 806 from different pixel cells. Moreover, digital output generator 806 can also be shared among a plurality of multiple pixel cells to generate the digital values.

Comparator 804 can compare the analog voltage developed at analog output node 614 against the threshold provided by threshold generator 802, and generate a decision 816 based on the comparison result. For example, comparator 804 can generate a logical one for decision 816 if the analog voltage at analog output node 614 equals or exceeds the threshold generated by threshold generator 802. Comparator 804 can also generate a logical zero for decision 816 if the analog voltage falls below the threshold. Decision 816 can control the counting operations of counter 808 and/or the count values stored in memory 810, to perform the aforementioned time-of-saturation measurement of a ramping analog voltage at analog output node 614 as well as quantization processing of the analog voltage at analog output node 614 for incident light intensity determination.

FIG. 9A illustrates an example of time-to-saturation measurement by pixel ADC 610. To perform the time-to-saturation measurement, threshold generator 802 can control DAC 813 to generate a fixed VREF 815. Fixed VREF 815 can be set at a voltage corresponding a charge quantity threshold for saturation of charge storage unit 608a (e.g., threshold 704 of FIG. 7). Counter 808 can start counting right after the exposure period starts (e.g., right after shutter switch 604 is disabled). As the analog voltage at analog output node 614 ramps down (or up depending on the implementation), clock signal 812 keeps toggling to update the count value at counter 808. The analog voltage may reach the fixed threshold at a certain time point, which causes decision 816 by comparator 804 to flip. The flipping of decision 816 may stop the counting of counter 808, and the count value at counter 808 may represent the time-to-saturation. As to be discussed in more details below, a rate of charge accumulation at charge storage unit 608a can also be determined based on the duration, and the incident light intensity can be determined based on the rate of charge accumulation.

FIG. 9B illustrates an example of quantizing an analog voltage by pixel ADC 610. After measurement starts, DAC 813 may be programmed by counter output 714 to generate a ramping VREF 815, which can either ramp up (in the example of FIG. 9B) or ramp down depending on implementation. The voltage range of ramping VREF 815 can be between threshold 704 (charge quantity threshold for saturation of storage unit 608) and threshold 702 (charge quantity threshold for saturation of photodiode 602), which can define the medium light intensity range. In the example of FIG. 9B, the quantization process can be performed with uniform quantization steps, with VREF 815 increasing (or decreasing) by the same amount for each clock cycle of clock signal 812. The amount of increase (or decrease) of VREF 815 corresponds to a quantization step. When VREF 815 reaches within one quantization step of the analog voltage at analog output node 614, decision 816 by comparator 804 flips. The flipping of decision 816 may stop the counting of counter 808, and the count value can correspond to a total number of quantization steps accumulated to match, within one quantization step, the analog voltage. The count value can become a digital representation of the quantity of charge stored at storage unit 608, as well as the digital representation of the incident light intensity. As discussed above, the quantization of the analog voltage can occur during the exposure period (e.g., for medium light intensity range 708) and after the exposure period (e.g., for low light intensity range 706).

As discussed above, ADC 610 can introduce quantization errors when there is a mismatch between a quantity of charge represented by the quantity level output by ADC 610 (e.g., represented by the total number of quantization steps) and the actual input quantity of charge that is mapped to the quantity level by ADC 610. The quantization error can be reduced by using a smaller quantization step size. In the example of FIG. 9B, the quantization error can be reduced by the amount of increase (or decrease) in VREF 815 per clock cycle.

Although quantization error can be reduced by using smaller quantization step sizes, area and performance speed may limit how far the quantization step can be reduced. With smaller quantization step size, the total number of quantization steps needed to represent a particular range of charge quantities (and light intensity) may increase. A larger number of data bits may be needed to represent the increased number of quantization steps (e.g., 8 bits to represent 255 steps, 7 bits to represent 127 steps, etc.). The larger number of data bits may require additional buses to be added to pixel output buses 616, which may not be feasible if pixel cell 600 is used on a head-mounted device or other wearable devices with very limited spaces. Moreover, with a larger number of quantization step size, ADC 610 may need to cycle through a larger number of quantization steps before finding the quantity level that matches (with one quantization step), which leads to increased processing power consumption and time, and reduced rate of generating image data. The reduced rate may not be acceptable for some applications that require a high frame rate (e.g., an application that tracks the movement of the eyeball).

Figures 10A, 10B:
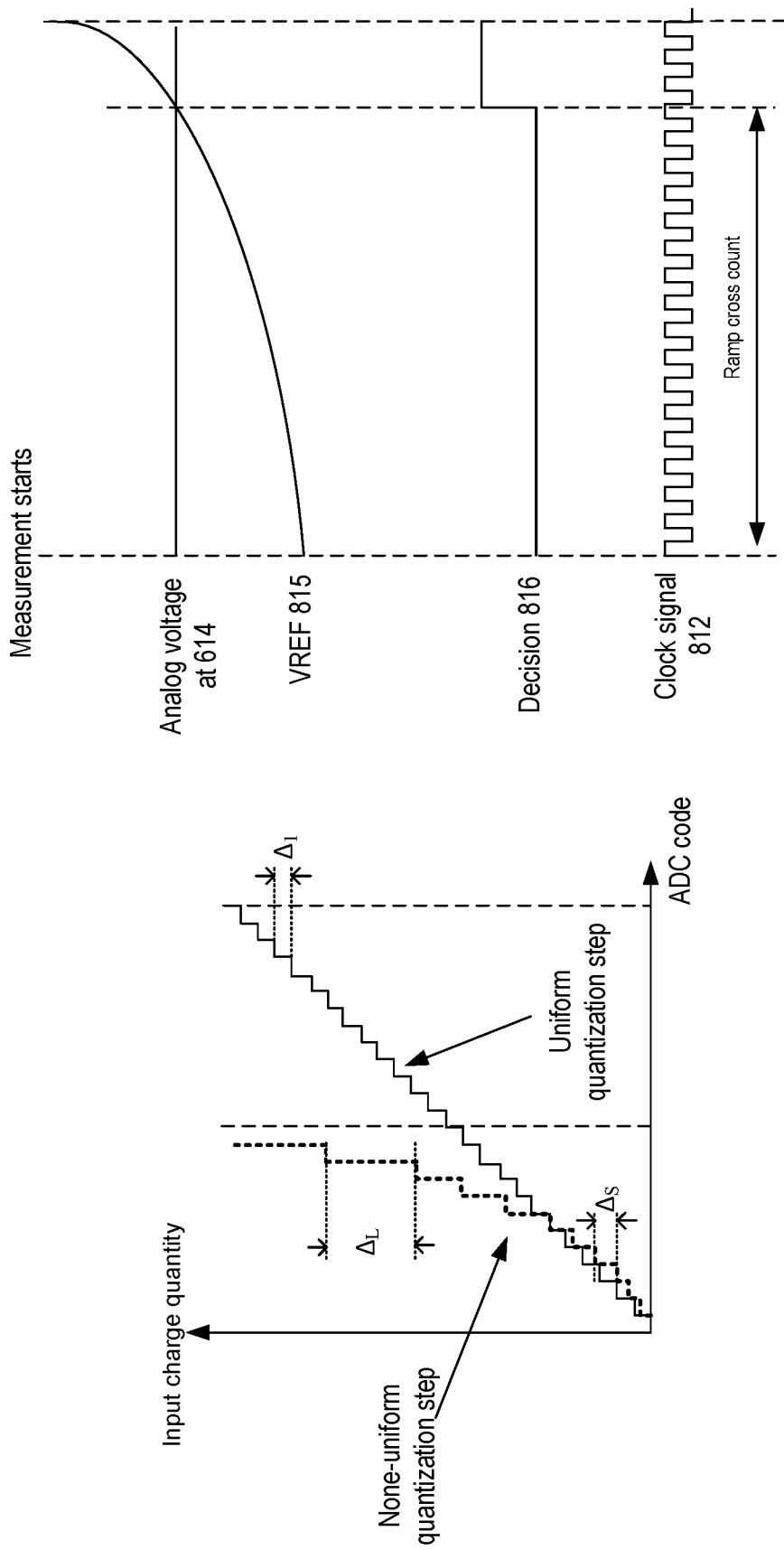
FIG. 10A and FIG. 10B illustrate techniques for performing quantization.

One way to reduce quantization error is by employing a non-uniform quantization scheme, in which the quantization steps are not uniform across the input range. FIG. 10A illustrates an example of a mapping between the ADC codes (the output of the quantization process) and the input charge quantity level for a non-uniform quantization process and a uniform quantization process. The dotted line illustrates the mapping for the non-uniform quantization process, whereas the solid line illustrates the mapping for the uniform quantization process. For the uniform quantization process, the quantization step size (denoted by $\Delta_1$) is identical for the entire range of input charge quantity. In contrast, for the non-uniform quantization process, the quantization step sizes are different depending on the input charge quantity. For example, the quantization step size for a low input charge quantity (denoted by $\Delta_S$) is smaller than the quantization step size for a large input charge quantity (denoted by $\Delta_L$). Moreover, for the same low input charge quantity, the quantization step size for the non-uniform quantization process ($\Delta_S$) can be made smaller than the quantization step size for the uniform quantization process ($\Delta_1$).

One advantage of employing a non-uniform quantization scheme is that the quantization steps for quantizing low input charge quantities can be reduced, which in turn reduces the quantization errors for quantizing the low input charge quantities, and the minimum input charge quantities that can be differentiated by ADC 610 can be reduced. Therefore, the reduced quantization errors can push down the lower limit of the measurable light intensity of the image sensor, and the dynamic range can be increased. Moreover, although the quantization errors are increased for the high input charge quantities, the quantization errors may remain small compared with high input charge quantities. Therefore, the overall quantization errors introduced to the measurement of the charge can be reduced. On the other hand, the total number of quantization steps covering the entire range of input charge quantities may remain the same (or even reduced), and the aforementioned potential problems associated with increasing the number of quantization steps (e.g., increase in area, reduction in processing speed, etc.) can be avoided.

FIG. 10B illustrates an example of quantizing an analog voltage by pixel ADC 610 using a non-uniform quantization process. Compared with FIG. 9B (which employs a uniform quantization process), VREF 815 increases in a non-linear fashion with each clock cycle, with a shallower slope initially and a steeper slope at a later time. The differences in the slopes are attributed to the uneven quantization step sizes. For lower counter count values (which correspond to a lower input quantity range), the quantization steps are made smaller, hence VREF 815 increases at a slower rate. For higher counter count values (which correspond to a higher input quantity range), the quantization steps are made larger, hence VREF 815 increases at a higher rate. The uneven quantization steps in VREF 815 can be introduced using different schemes. For example, as discussed above, DAC 813 is configured to output voltages for different counter count values (from counter 808). DAC 813 can be configured such that the difference in the output voltage between two neighboring counter count values (which defines the quantization step size) is different for different counter count values. As another example, counter 808 can also be configured to generate jumps in the counter count values, instead of increasing or decreasing by the same count step, to generate the uneven quantization steps. In some examples, the non-uniform quantization process of FIG. 10B can be employed for light intensity determination for low light intensity range 706 and medium light intensity range 708.

Figure 11:
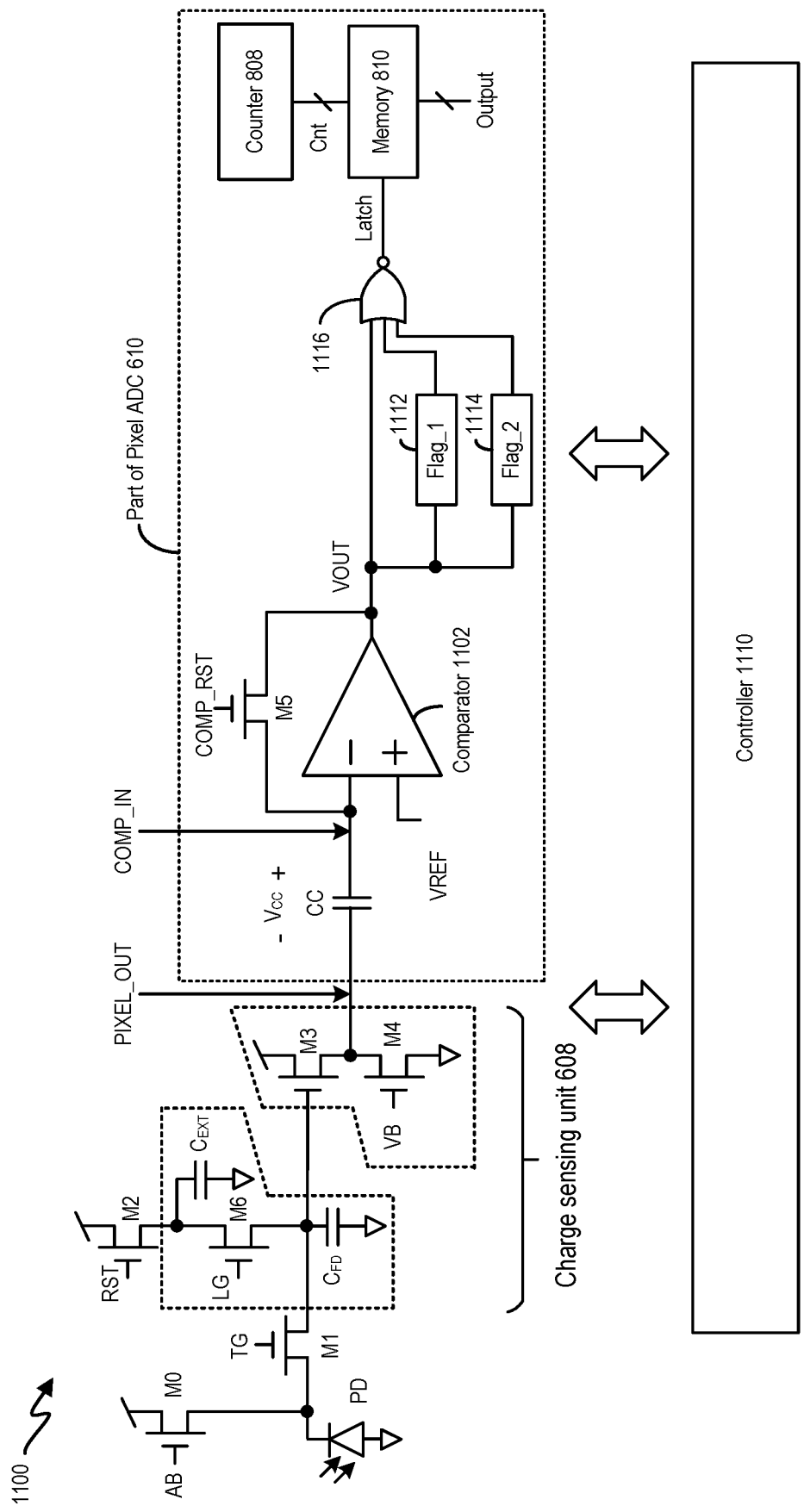
FIG. 11 illustrates block diagrams of an embodiment of a pixel cell.

Reference is now made to FIG. 11, which illustrates an example of pixel cell 1100, which can be an embodiment of pixel cell 600 of FIG. 6. In the example of FIG. 11, PD can correspond to photodiode 602, transistor M0 can correspond to shutter switch 604, transistor M1 can correspond to transfer gate 606, whereas transistor M2 can correspond to reset switch 607. Moreover, a combination of $C_{FD}$ (e.g., a floating drain) and $C_{EXT}$ capacitors can correspond to storage unit 608. The capacitance of charge storage unit 608a is configurable by the signal LG. When LG is enabled, charge storage unit 608a provides combined capacities of $C_{FD}$ and $C_{EXT}$ capacitors. When LG is disabled, the $C_{EXT}$ capacitor can be disconnected from the parallel combination, and charge storage unit 608a comprises only a $C_{FD}$ capacitor (plus other parasitic capacitances). As discussed above, the capacitance of charge storage unit 608a can be reduced to increase the charge-to-voltage conversion ratio for the low light intensity determination, and can be increased to provide the requisite capacity for the medium light intensity determination.

Pixel cell 1100 further includes an example of buffer 608b and an example of pixel ADC 610. For example, transistors M3 and M4 can form a switchable source follower which can be buffer 608b of FIG. 6 to buffer an analog voltage developed at the PIXEL_OUT node, which represents a quantity of charge stored at storage unit 608. Further, the CC cap, comparator 1102, transistor switch M5, NOR gate 1116, together with memory 810, can be part of pixel ADC 610 to generate a digital output representing the analog voltage at the OF node. As described above, the quantization can be based on a comparison result (VOUT), generated by comparator 1102, between the analog voltage developed at the PIXEL_OUT node and VREF. Here, the CC cap is configured as a sampling capacitor to generate a COMP_IN voltage (at one input of comparator 1102) which tracks the output of buffer 608b (and PIXEL_OUT), and provides the COMP_IN voltage to comparator 1102 to compare against VREF. VREF can be a static voltage for time-of-saturation measurement (for high light intensity range) or a ramping voltage for quantization of an analog voltage (for low and medium light intensity ranges). The count values (labelled "cnt" in FIG. 11) can be generated by a free-running counter (e.g., counter 808), and the comparison result generated by comparator 1102 can determine the count values to be stored in memory 810 and to be output as the digital representation of the incident light intensity. In some examples, the generation of VREF for low and medium light intensity determination can be based on a non-uniform quantization scheme as discussed in FIG. 10A and FIG. 10B.

Pixel cell 1100 can include features that can further improve the accuracy of the incident light intensity determination. For example, the combination of the CC capacitor, transistor M5, as well as transistor M2, can be operated to compensate for measurement errors (e.g., comparator offset) introduced by comparator 1102, as well as other error signals such as, for example, reset noise introduced to charge storage unit 608a by transistor M2. As to be described below, in a first sampling operation, M2 and M5 can be closed to, respectively, reset charge storage unit 608a (and charge sensing unit 608) and comparator 1102. With charge storage unit 608a reset, the CC capacitor can store noise charge introduced by the reset operation. Moreover, with M5 closed, the voltage of the negative terminal of comparator 1102 ($V_{COMP\_IN}$) can track the voltage of the positive terminal of comparator 1102 but differ by the comparator offset. As a result, a quantity of noise charge reflecting the comparator offset as well as the reset noise can be stored at the CC capacitor to develop a voltage difference $V_{CC}$ across the CC capacitor, and $V_{CC}$ can include components representing the comparator offset and the reset noise.

In a second sampling operation, M2 and M5 can be opened so that charge storage unit 608a and comparator 1102 can exit the respective reset state. Charge storage unit 608a can accumulate charge from photodiode PD during an integration period to develop a voltage, which can be buffered by buffer 608b to generate the voltage at PIXEL_OUT, $V_{pixel\_out}$. The reset noise charge introduced by transistor M2 in the reset operation also remains in storage unit 608, therefore $V_{pixel\_out}$ also includes the component of the reset noise. Through ac-coupling, a new $V_{comp\_in}$ can be obtained, and the new $V_{comp\_in}$ tracks $V_{pixel\_out}$ based on the addition of $V_{CC}$. As $V_{CC}$ also contains the component of the reset noise, the reset noise component can be cancelled out in the new $V_{COMP\_IN}$, which still includes the component of comparator offset. Comparator 1102 can compare the new $V_{COMP\_IN}$ voltage against VREF to generate a decision (VOUT) to control a time when to store the output of counter 808 at memory 810, to quantize the quantity of charge stored at charge storage unit 608a. The comparator offset component in the new $V_{comp\_in}$ can cancel out or substantially reduce the effect of the comparator offset of comparator 1102. As both the comparator offset and reset noise are eliminated or at least substantially reduced, the accuracy of quantization can be improved.

In some embodiments, as to be discussed below, the combination of the CC cap, transistor M5, as well as transistor M2, can be operated to perform the first and second sampling operations after the integration period, to reduce the effect of charge leakage on the measurement error compensation operation. In some embodiments, the integration period can be adaptive to the light intensity, and these components can be operated in different measurement error compensation operations based on the light intensity. For example, the components can be operated to perform correlated double sampling operations, where the first sampling operation and the second sampling operation are separated by the integration period, if the integration period is shorter than a threshold (e.g., for sampling medium and high light intensity) and/or where the degree of charge leakage of the sampling capacitor within the integration period is within a tolerance range. These components can also be operated to perform the first and second sampling operations after the integration period if the integration period exceeds the threshold (e.g., for sampling low light intensity) and/or where the degree of charge leakage of the sampling capacitor within the integration period exceeds the tolerance range.

In addition, pixel cell 1100 further includes a controller 1110, which can be part of or external to ADC 610. Controller 1110 can generate a sequence of control signals, such as AB, TG, RST, COMP_RST, etc., to operate pixel cell 1100 to perform a three-phase measurement operation corresponding to the three light intensity ranges of FIG. 7 (e.g., low light intensity range 706, medium light intensity range 708, and high light intensity range 710), and to perform the measurement error compensation operations as described above. In each phase, pixel cell 1100 can be operated in a measurement mode targeted for the corresponding light intensity range, and determine whether the incident light intensity falls within the corresponding light intensity range based on the decision output (VOUT) of comparator 1102.

Pixel cell 1100 further includes a set of registers to store the decision outputs of some of the phases as FLAG_1 and FLAG_2 signals. Based on the FLAG_1 and FLAG_2 signals, controller 1110 can select the count value output in one of the three phases to represent the incident light intensity. The selected count value can be stored in memory 810, and memory 810 can be locked based on a combination of the FLAG_1 and FLAG_2 signals by NOR gate 1116 to prevent subsequent measurement phases from overwriting the selected ADC code output in memory 810. At the end of the three-phase measurement process, controller 1110 can retrieve the count value stored in memory 810 and provide the count value as the digital output representing the incident light intensity.

Figure 12A:
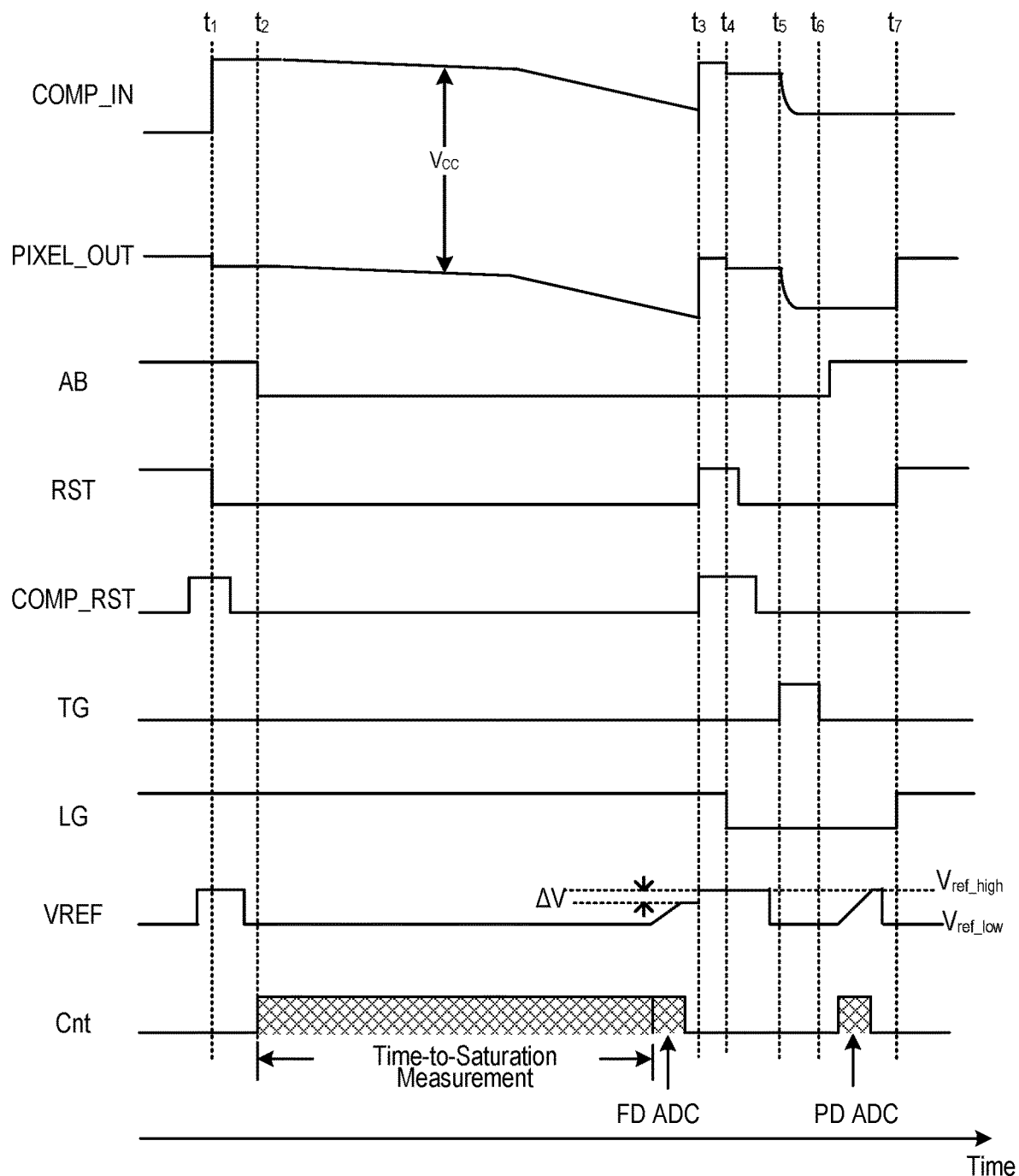
FIG. 12A and FIG. 12B illustrate an example sequence of control signals to perform light intensity measurement.
Figure 12B:
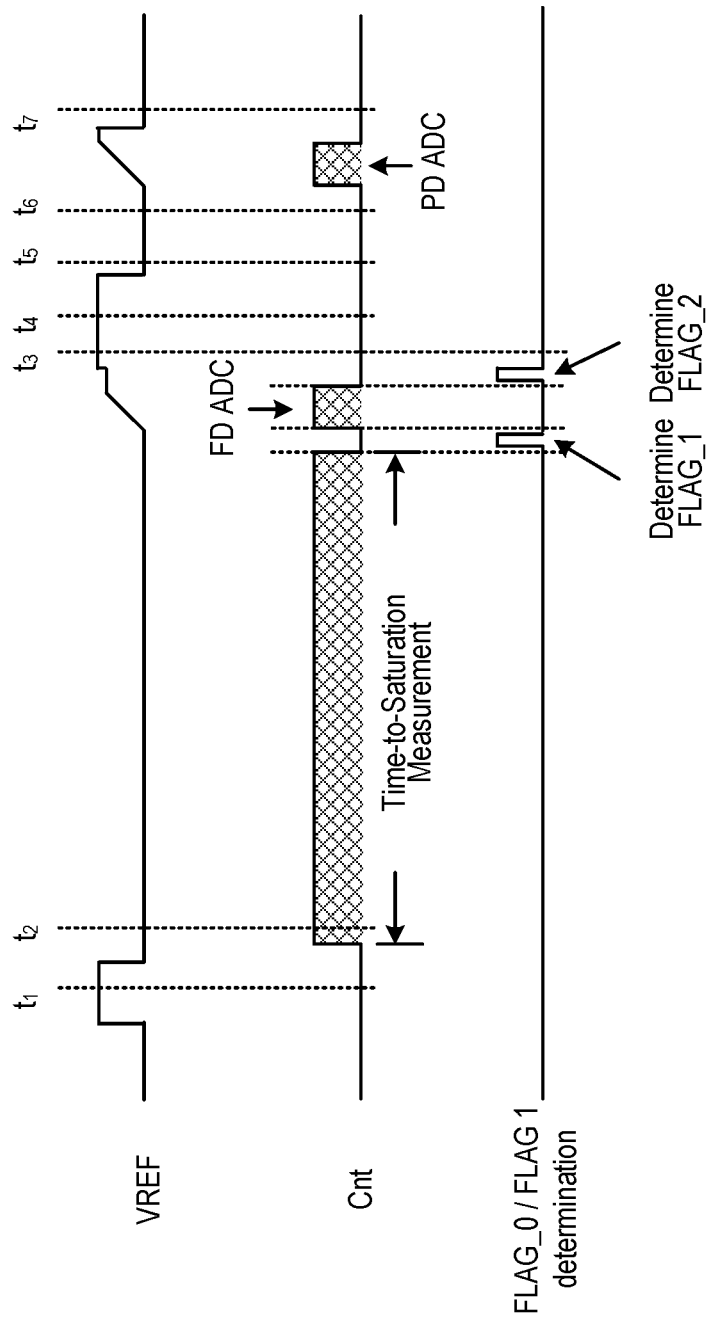

Reference is now made to FIG. 12A and FIG. 12B, which illustrate an example sequence of the control signals of pixel cell 1100 for the three-phase measurement operation and an example measurement error compensation operation. FIG. 12A illustrates the change of COMP_IN, PIXEL_OUT, AB, RST, COMP_RST, TG, LG, VREF, and cnt (count values from counter 808) with respect to time. The example measurement error compensation operation in FIG. 12A can be based on correlated double sampling. Referring to FIG. 12A, the time period before $t_1$ can correspond to a first reset phase, in which charge storage unit 608a (and charge sensing unit 608) and comparator 1102 can be put in a reset state by controller 1110 by asserting the RST and COMP_RST signals. Between times $t_1$ and $t_2$ charge storage unit 608a and comparator 1102 can exit the reset state, while the shutter signal AB can remain asserted to prevent charge generated by photodiode PD from reaching charge storage unit 608a. As to be described below, a first sampling operation can be performed at time $t_2$ to sample the reset noise introduced by transistor M2 as a result of entering and exiting the reset state. The time period between $t_2$ and $t_3$ can correspond to an integration period, in which the shutter signal AB can be de-asserted to allow the charge overflow from photodiode PD (after the photodiode reaches its residual charge storage capacity) to be accumulated at charge storage unit 608a. Two phases of measurement can be performed during the integration period including a time-to-saturation (TTS) measurement phase for high light intensity range 710 and an FD ADC phase for measurement of overflow charge for medium light intensity 708. The time period between $t_3$ and $t_5$ can correspond to a second reset phase, in which charge storage unit 608a and comparator 1102 can be put in the reset state again. Between times $t_5$ and $t_6$ controller 1102 can assert TG to enable transistor M1 to transfer residual charge stored in the photodiode PD to charge storage unit 608a. A third phase of measurement, PD ADC, can be performed between times $t_6$ and $t_7$ to measure the residual charge for low light intensity range 712. Pixel cell 1100 can provide the digital output representing the incident light intensity from one of the measurement results from TTS, FD ADC, or PD ADC phases, and then start the next three-phase measurement operation.

The measurement operation in TTS is similar to the operation described in FIG. 9A, in which the PIXEL_OUT voltage is compared with a static $VREF_{LOW}$ representing a saturation level of charge storage unit 608a by comparator 1102. When PIXEL_OUT voltage reaches the static VREF, the output of comparator 1102 (VOUT) can trip, and a count value from counter 808 at the time when VOUT trips can be stored into memory 810. In addition, referring to FIG. 12B, controller 1110 can determine the state of VOUT of comparator 1102 at the end of the TTS phase, and can assert FLAG_1 signal if VOUT is asserted. The assertion of the FLAG_1 signal can indicate that charge storage unit 608a saturates and can prevent subsequent measurement phases (FD ADC and PD ADC) from overwriting the count value stored in memory 810. The count value from TTS can then be provided to represent the intensity of light received by the photodiode PD during the integration period.

In addition, the FD ADC and PD ADC measurement operations are similar to the operation described with respect to FIG. 9B, in which the PIXEL_OUT voltage is compared with a ramping VREF by comparator 1102. The FD ADC phase can follow the TTS phase. As shown in FIG. 12A, the VREF ramp can start from $V_{ref\_low}$ to $V_{ref\_high}$. The range between $V_{ref\_low}$ to $V_{ref\_high}$ can correspond to a full-scale input range of ADC 610. For FD ADC, $V_{ref\_high}$ can correspond to a minimum quantity of overflow charge stored in charge storage unit 608a which separates between low light intensity range 706 and medium light intensity range 708, whereas $V_{ref\_low}$ can correspond to the saturation threshold of charge storage unit 608a that separates between medium light intensity range 708 and high light intensity range 710. If VOUT of comparator 1102 trips during FD ADC, the count value of counter 808 at the time when VOUT trips can be stored in memory 810. As shown in FIG. 12B, controller 1110 can determine the state of VOUT of comparator 1102 at the end of FD ADC, and can assert FLAG_2 if VOUT is asserted. The assertion of FLAG_2 can indicate that charge storage unit 608a stores more than the minimum quantity of overflow charge and can prevent subsequent PD ADC phase from overwriting the count value stored in memory 810. The count value from FD ADC can then be provided to represent the intensity of light.

Meanwhile, in the PD ADC phase, the PIXEL_OUT voltage, which represents the residual charge stored in photodiode PD, can be compared with the VREF ramp that starts from $V_{ref\_low}$ to $V_{ref\_high}$. In PD ADC phase, $V_{ref\_high}$ can represent the minimum detectable quantity of residual charge stored in photodiode PD, whereas $V_{ref\_low}$ can represent the saturation threshold of photodiode PD beyond which the photodiode PD transfers overflow charge to charge storage unit 608. If neither FLAG_1 nor FLAG_2 is asserted prior to PD ADC, the count value obtained when comparator 1102 trips during PD ADC can be stored into memory 810, and the count value from PD ADC can be provided to represent the intensity of light.

In some examples, to mitigate the risk of false overflow charge detection and tripping during FD ADC due to the presence of dark current in the floating drain (e.g., $C_{FD}$ of charge storage unit 608), the range of VREF ramp for FD ADC can be reduced. For example, as shown in FIG. 12A, a voltage headroom $\Delta V$ is introduced to reduce $V_{ref\_high}$. With such an arrangement, the VREF ramp will not cross PIXEL_OUT voltage (and comparator 1102 will not trip) if PIXEL_OUT voltage is below the unmodified $V_{ref\_high}$ only due to the presence of dark current, and the likelihood of false tripping due to the presence of dark current can be reduced.

As discussed above, the sequence of control signals in FIG. 12A can control pixel cell 1100 to perform a measurement error compensation operation, such as correlated double sampling. The following is an example correlated double sampling operation provided by the sequence of control signals in FIG. 12A.

A first sampling operation can be performed at time $t_2$ before the integration period starts. At time $t_2$, after charge storage unit 608a has been reset, PIXEL_OUT can be reset to a reset voltage $V_{pixel\_out\_rst}$. Moreover, the first reset phase also introduces reset noise charge into charge storage unit 608. The reset noise charge introduces a noise voltage component $V\sigma_{KTC}$. Therefore, at time $t_2$, the voltage of the left plate of the CC cap ($V_{pixel\_out}$) can be as follows:

$$V_{pixel\_out}(t_2)=V_{pixel\_out\_rst}+V\sigma_{KTC} \quad \text{(Equation 1)}$$

Moreover, with comparator 1102 in a reset state, the voltage $V_{comp\_in}$ of the right plate of the CC cap (connected to the negative terminal of comparator 1102) can track the voltage of the positive terminal of comparator 1102 but differ by the comparator offset $V_{comp\_offset}$. With the positive terminal connected with $V_{ref\_low}$, the voltage of COMP_IN ($V_{comp\_in}$) can be as follows:

$$V_{comp\_in}(t_2)=V_{ref\_low}+V_{comp\_offset} \quad \text{(Equation 2)}$$

At time $t_2$, the voltage difference $V_{cc}$ between PIXEL_OUT and COMP_IN can be as follows:

$$V_{cc}(t_2)=V_{comp\_in}(t_2)-V_{pixel\_out}(t_2) \quad \text{(Equation 3)}$$

Combining Equations 1, 2, and 3, the voltage difference $V_{cc}$ at time $t_2$ can be as follows:

$$V_{cc}(t_2)=(V_{ref\_low}+V_{comp\_offset})-(V_{pixel\_out\_rst}+V\sigma_{KTC}) \quad \text{(Equation 4)}$$

The voltage difference $V_{cc}(t_2)$ can represent a result of the first sampling operation.

Between $t_2$ and $t_3$, charge storage unit 608a can accumulate overflow charge from the photodiode PD. The overflow charge can develop a voltage $V_{pixel\_out\_sig}$ at charge storage unit 608. In addition, the reset noise charge injected by the first reset phase remains in charge storage unit 608.

At the end of integration, at time $t_3$, a second sampling operation can be performed to measure the quantity of overflow charge at charge storage unit 608. At time $t_3$, the voltage of the left plate of the CC cap ($V_{pixel\_out}$) can be as follows:

$$V_{pixel\_out}(t_3)=V_{pixel\_out\_sig}+V\sigma_{KTC} \quad \text{(Equation 5)}$$

$V_{pixel\_out}(t_3)$ can represent a result of the second sampling operation.

Via ac-coupling, the voltage of the right plate of the CC cap ($V_{COMP\_IN}$) at time $t_3$ can track $V_{pixel\_out}(t_3)$ but differ by the voltage difference $V_{cc}(t_3)$ as follows:

$$V_{comp\_in}(t_3)=V_{pixel\_out}(t_3)+V_{cc}(t_3) \quad \text{(Equation 6)}$$

If $V_{cc}(t_3)$ is identical to $V_{cc}(t_2)$, $V_{cc}(t_3)$ can also include the reset charge noise component $V\sigma_{KTC}$. Equation 6 can be rewritten as follows:

$$V_{comp\_in}(t_3)=V_{pixel\_out\_sig}+V\sigma_{KTC}+(V_{ref\_low}+V_{comp\_offset})-(V_{pixel\_out\_rst}+V\sigma_{KTC}) \quad \text{(Equation 7)}$$

As shown in Equation 7, the $V\sigma_{KTC}$ component of $V_{pixel\_out}(t_3)$ and the $V\sigma_{KTC}$ component of $V_{cc}(t_3)$ can be cancelled out. Equation 7 can be simplified as follows:

$$V_{comp\_in}(t_3)=V_{pixel\_out\_sig}-V_{pixel\_out\_rst}+V_{ref\_low}+V_{comp\_offset} \quad \text{(Equation 8)}$$

As shown in Equation 8, $V_{comp\_in}(t_3)$ includes a difference component $V_{pixel\_out\_sig}-V_{pixel\_out\_rst}$ which represents the quantity of charge from the photodiode and accumulated by charge storage unit 608a during the integration period. $V_{COMP\_IN}(t_3)$ further includes the $V_{comp\_offset}$ component as well as $V_{ref\_low}$ (from $V_{cc}$). When comparator 1102 compares $V_{COMP\_IN}(t_3)$ with $V_{ref\_low}$, the comparator offset introduced by comparator 1102 can be cancelled by the $V_{comp\_offset}$ component, and only the difference $V_{pixel\_out\_sig}-V_{pixel\_out\_rst}$, which represents the quantity of charge from the photodiode, is quantized to generate the quantization result. Such arrangements can remove the reset noise and comparator offset from the quantization result and improve the accuracy of light intensity measurement.

Following FD ADC, comparator 1102 and charge storage unit 608a can be reset between times $t_3$ and $t_5$ to store the reset noise charge and comparator offset information in the CC capacitor as the first sampling operation of the correlated double sampling operation. The TG signal can be asserted between times $t_5$ and $t_6$ to transfer the residual charge from the photodiode PD to charge storage unit 608a, and a second sampling operation can be performed to measure the residual charge stored in charge storage unit 608a at time $t_6$. $V_{comp\_in}$ at $t_6$ can be defined according to Equation 8, with $V_{pixel\_out\_sig}-V_{pixel\_out\_rst}$ representing the quantity of residual charge and quantized in the PD ADC phase between times $t_6$ and $t_7$.

As shown above, the cancellation of reset noise and comparator offset in the correlated double sampling operation of FIG. 12A depends on the voltage difference across the CC capacitor, $V_{cc}$, being constant across the integration period, such that by the end of integration period $V_{cc}$ retains the reset noise component $V\sigma_{KTC}$ and $V_{comp\_offset}$ measured before the integration period starts. However, due to charge leakage from the CC capacitor, the noise charge representing the reset noise and the comparator offset may leak from the right plate of the CC capacitor via the negative terminal comparator 1102, which is floating during the integration period. As a result, at the end of integration period, $V_{cc}$ does not include accurate representations of the comparator offset and reset noise sampled before the integration period.

Figure 13:
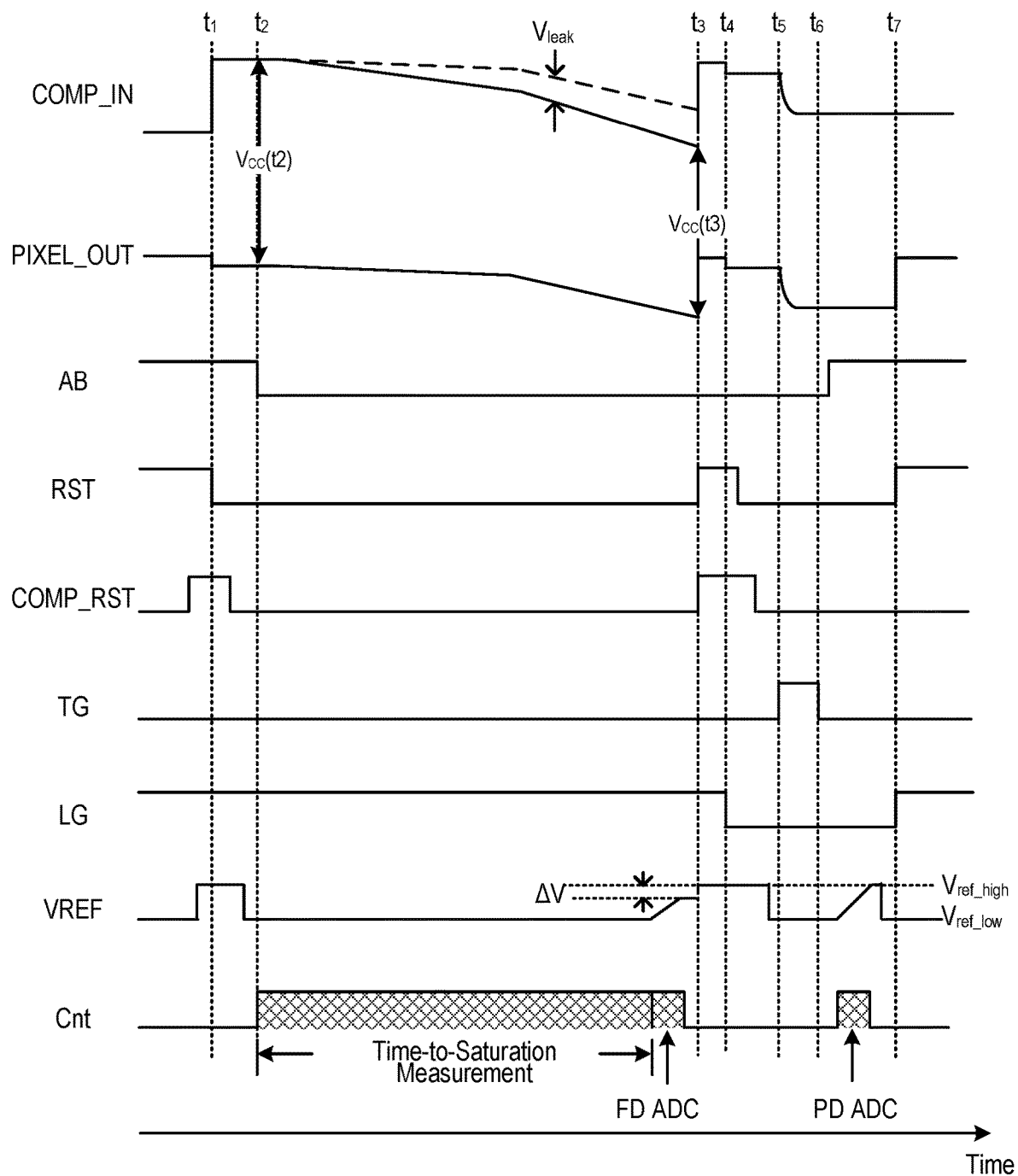
FIG. 13 illustrates an example of effect of charge leakage on the light intensity measurement operation of FIG. 12A and FIG. 12B.

FIG. 13 illustrates an example of the effect of charge leakage from the CC capacitor. In FIG. 13, the dotted line for COMP_IN represents $V_{comp\_in}$ without the effect of charge leakage from the CC capacitor, and is identical to the corresponding graph in FIG. 12A. The solid line for COMP_IN represents the actual $V_{comp\_in}$ under the effect of charge leakage from the CC capacitor. As shown in FIG. 13, between $t_2$ and $t_3$, $V_{comp\_in}$ may drift. The drifting can be due to charge leakage from the right plate of the CC capacitor via the negative terminal (COMP_IN) of comparator 1102 being floating. As the total quantity of leaked charge is accumulative, the degree of drift, labelled by $V_{leak}$, increases with time. Because of the drifting, $V_{cc}$ also changes with time between times $t_2$ and $t_3$. As a result, some or all of the noise charge and comparator offset information, sampled at time $t_2$, is lost at time $t_3$. As $V_{cc}(t_3)$ no longer includes an accurate representation of the reset noise, the reset noise of $V_{pixel\_out}(t_3)$ cannot be cancelled when $V_{pixel\_out}(t_3)$ combines with $V_{cc}(t_3)$ into $V_{comp\_in}(t_3)$ as shown in Equations 7 and 8. Moreover, as $V_{cc}(t_3)$ (and $V_{comp\_in}(t_3)$) no longer include an accurate representation of the comparator offset, the offset of comparator 1102 also cannot be eliminated when comparing $V_{comp\_in}(t_3)$.

Figure 14A:
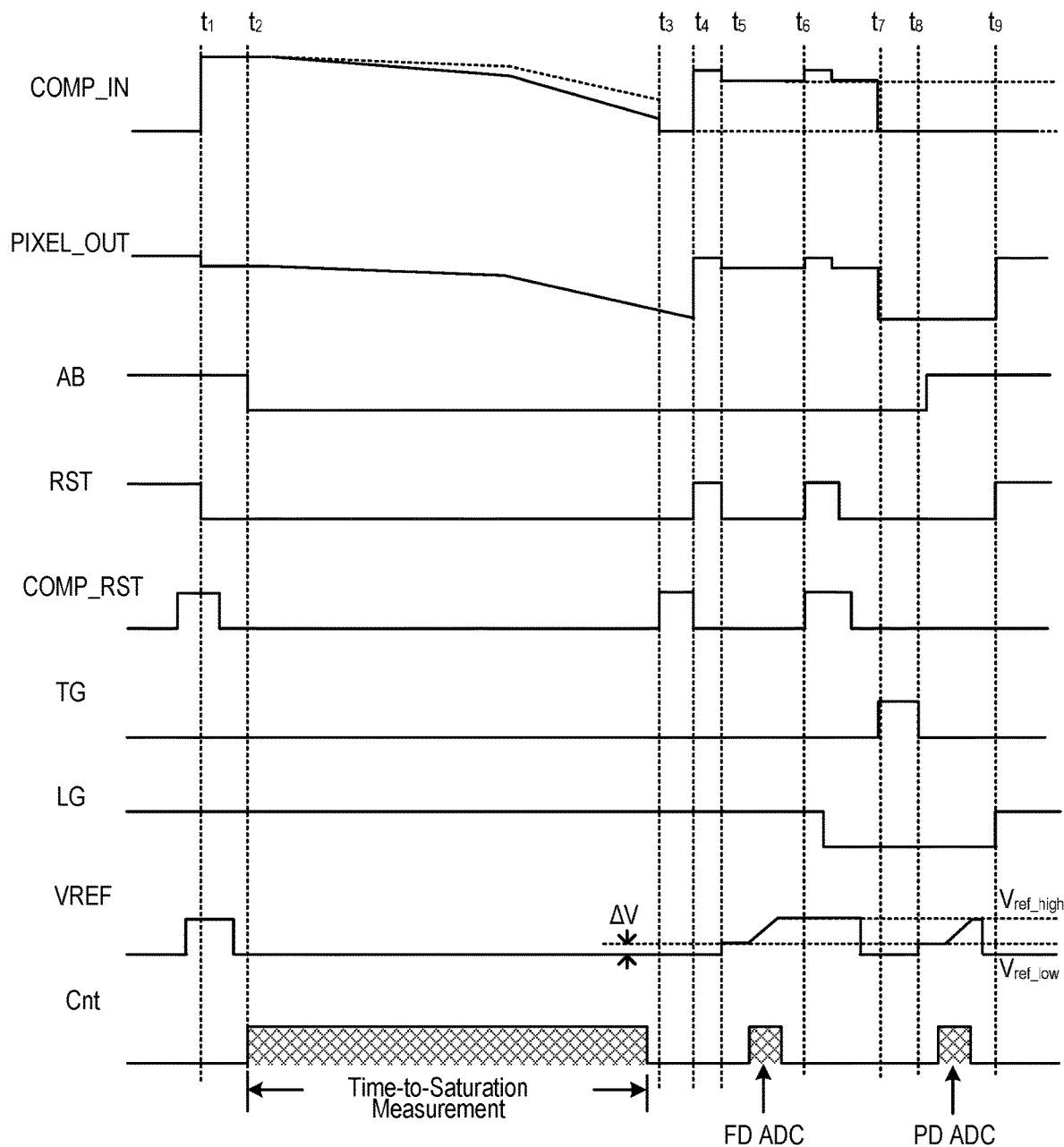
FIG. 14A and FIG. 14B illustrate another example sequence of control signals to perform light intensity measurement.
Figure 14B:
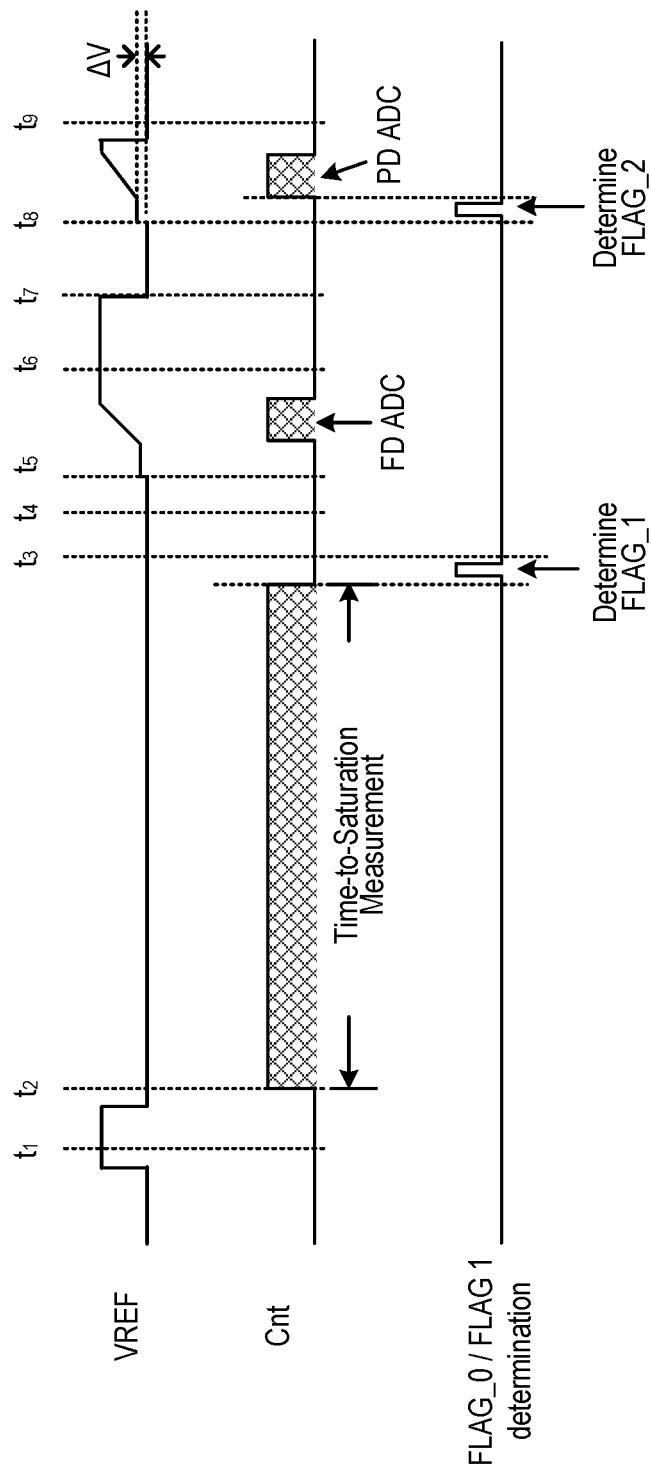

FIG. 14A and FIG. 14B illustrates an example sequence of the control signals of pixel cell 1100 for the three-phase measurement operation and an example measurement error compensation operation. In the example measurement error compensation operation, two sampling operations can be performed after the integration period. In the first sampling operation, comparator 1102 can be reset, and the first sampling operation can measure the charge accumulated by charge storage unit 608a during the integration period, which includes the first reset noise charge from a prior reset operation, and the comparator offset. After the first sampling operation, charge storage unit 608a can be reset, and a second sampling operation can be performed to measure the second reset noise charge introduced by the resetting of the charge storage unit. The results of the first sampling operation and the second sampling operation can be combined, and the combined result can be quantized. The combined result includes a noise component representing a difference between the first reset noise charge and the second noise charge. As the noise component is smaller than either the first reset noise charge or the second reset noise charge, the effect of reset noise on the measurement of charge accumulated by charge storage unit 608a during the integration period can be compensated. Meanwhile the combined result also retains the comparator offset component, which can be used to compensate for the comparator offset of comparator 1102 during the quantization operation.

Referring to FIG. 14A, the time period before $t_1$ can correspond to a first reset phase, in which charge storage unit 608a and comparator 1102 can be put in a reset state by controller 1110 by asserting the RST and COMP_RST signals. The first reset phase also introduces a first reset noise charge into charge storage unit 608a, represented by voltage component $V\sigma_{KTC1}$. Between times $t_2$ and $t_3$, which correspond to the integration period, both comparator 1102 and charge storage unit 608a are out of the reset state, and charge storage unit 608a can accumulate overflow charge from the photodiode PD to develop the voltage $V_{pixel\_out\_sig}$ at time $t_3$.

After the end of integration, at time $t_4$, a first sampling operation can be performed. The voltage of the left plate of the CC cap ($V_{pixel\_out}$) can be as follows:

$$V_{pixel\_out}(t_4)=V_{pixel\_out\_sig}+V\sigma_{KTC1} \quad \text{(Equation 9)}$$

Between times $t_3$ and $t_4$, comparator 1102 can be reset as part of the first sampling operation. As a result of resetting comparator 1102, the voltage $V_{comp\_in}$ of the right plate of the CC cap (connected to the negative terminal of comparator 1102) can track the voltage of the positive terminal of comparator 1102 but differ by the comparator offset $V_{comp\_offset}$, similar to Equation 2 above. At time $t_4$, $V_{comp\_in}$ can be as follows:

$$V_{comp\_in}(t_4)=V_{ref\_low}+V_{comp\_offset} \quad \text{(Equation 10)}$$

At time $t_4$, the voltage difference across the CC capacitor, $V_{CC}$, becomes the following:

$$V_{cc}(t_4)=V_{comp_{in}}(t_4)-V_{pixel_{out}}(t_4) \quad \text{(Equation 11)}$$

Combining Equations 9, 10, and 11, the voltage difference $V_{cc}$ at time $t_4$ can be as follows:

$$V_{cc}(t_4)=(V_{ref\_low}+V_{comp\_offset})-(V_{pixel\_out\_sig}+V\sigma_{KTC1}) \quad \text{(Equation 12)}$$

The voltage difference $V_{cc}$ at time $t_4$ can be stored in the CC capacitor as a result of the first sampling operation. The result of the first sampling operation includes a component representing the charge transferred from the photodiode to charge storage unit 608a during the integration period ($V_{pixel\_out\_sig}$), a component representing the first reset noise charge ($V\sigma_{KTC1}$), and a component representing the comparator offset of comparator 1102 ($V_{comp\_offset}$).

Between times $t_4$ and $t_5$, charge storage unit 608a can be reset, while comparator 1012 exits the reset state, as part of a second sampling operation. As a result of resetting charge storage unit 608a, PIXEL_OUT can be reset to a reset voltage $V_{pixel\_out\_rst}$. Moreover, second reset noise charge is also introduced into charge storage unit 608a, which can be represented by $V\sigma_{KTC2}$. The second reset noise charge may tracks the first reset noise charge. At time $t_5$, the voltage of the left plate of the CC capacitor ($V_{pixel\_out}$) can be as follows:

$$V_{pixel\_out}(t_5)=V_{pixel\_out\_rst}+V\sigma_{KTC2} \quad \text{(Equation 13)}$$

$V_{pixel\_out}(t_5)$ can be a result of the second sampling operation.

Via ac-coupling, the voltage of the right plate of the CC cap ($V_{comp\_in}$) at time $t_5$ can track $V_{pixel\_out}(t_5)$ but differ by the voltage difference $V_{cc}(t_5)$ based on the following equation:

$$V_{comp\_in}(t_5)=V_{pixel\_out}(t_5)+V_{cc}(t_5) \quad \text{(Equation 14)}$$

As the difference between times $t_4$ and $t_5$ is typically very short (and is also typically much shorter than the integration period), the charge leakage from the CC capacitor is also very small. Therefore, $V_{cc}(t_5)$ and $V_{cc}(t_4)$ are largely identical. $V_{comp\_in}(t_5)$ can be defined based on Equations 12, 13, and 14 as follows:

$$V_{comp\_in}(t_5)=V_{pixel\_out\_rst}+V\sigma_{KTC2}+(V_{ref\_low}+V_{comp\_offset})-(V_{pixel\_out\_sig}+V\sigma_{KTC1}) \quad \text{(Equation 15)}$$

Equation 15 can be rearranged as follows:

$$V_{comp\_in}(t_5)=(V_{ref\_low}+V_{comp\_offset})+(V_{pixel\_out\_rst}-V_{pixel\_out\_sig})+(V\sigma_{KTC2}-V\sigma_{KTC1}) \quad \text{(Equation 16)}$$

As shown in Equation 16, $V_{comp\_in}(t_5)$ includes a noise component representing a combination of $V\sigma_{KTC1}$ and $V\sigma_{KTC2}$ of, respectively, the first reset noise and the second reset noise. In a case where the first reset noise and the second reset noise track each other and have the same polarity, the noise component can become smaller than either $V\sigma_{KTC1}$ or $V\sigma_{KTC2}$. As a result, the reset noise component in $V_{comp\_in}$ can be reduced. Meanwhile, the comparator offset component $V_{comp\_offset}$ remains in $V_{comp\_in}$. The comparator offset component can cancel out the comparator offset of comparator 1102 when comparator 1102 compares $V_{comp\_in}$ to perform the quantization.

Following the second sampling operation, $V_{comp\_in}$ can be quantized by comparing against the VREF ramp. In the quantization operation of FIG. 14A, as $V_{comp\_in}$ represents $V_{pixel\_out\_rst}-V_{pixel\_out\_sig}$, the polarity of comparison is opposite to the quantization operation of FIG. 12A where $V_{comp\_in}$ represents $V_{pixel\_out\_sig}-V_{pixel\_out\_rst}$. In FIG. 14A, $V_{ref\_low}$ can represent the minimum quantity of overflow charge in charge storage unit 608a which separates between the low light intensity range 706 and medium light intensity range 708, whereas $V_{ref\_high}$ can represent the saturation limit of charge storage unit 608a which separates between the medium light intensity range 708 and high light intensity range 710. The determination of the FLAG_2 signal to indicate whether charge storage unit 608a stores the minimum quantity of overflow charge can be based on comparing $V_{comp\_in}$ with $V_{ref\_low}$ during FD ADC.

Following FD ADC, the PD ADC phase can be performed to quantize the residual charge in the photodiode PD. A correlated double sampling operation can be performed to reduce the effect of reset noise on the quantization of the residual charge. Specifically, between times $t_6$ and $t_7$, comparator 1102 and charge storage unit 608a can be reset to store the reset noise charge and comparator offset information in the CC capacitor as the first sampling operation of the correlated double sampling operation. The TG signal can be asserted between times $t_7$ and $t_8$ to transfer the residual charge from the photodiode PD to charge storage unit 608a, and a second sampling operation can be performed to measure the residual charge stored in charge storage unit 608a at time $t_8$. $V_{comp\_in}$ at $t_8$ can be defined according to Equation 8, with $V_{pixel\_out\_sig}-V_{pixel\_out\_rst}$ representing the quantity of residual charge and quantized in the PD ADC phase between times $t_8$ and $t_9$. In the PD ADC phase, $V_{ref\_high}$ can represent the minimum detectable quantity of residual charge stored in photodiode PD, whereas $V_{ref\_low}$ can represent the saturation threshold of photodiode PD beyond which the photodiode PD transfers overflow charge to charge storage unit 608. If neither FLAG_1 nor FLAG_2 is asserted prior to PD ADC, the count value obtained when comparator 1102 trips during PD ADC can be stored into memory 810, and the count value from PD ADC can be provided to represent the intensity of light, as in the PD ADC operation of FIG. 12A.

Similar to the example operation in FIG. 12A, to mitigate the risk of false overflow charge detection and tripping during FD ADC due to presence of dark current in the floating drain (e.g., $C_{FD}$ of charge storage unit 608), the range of the VREF ramp for FD ADC can be reduced in FIG. 14A, in which a voltage headroom $\Delta V$ can be introduced to the threshold voltage representing the minimum quantity of overflow charge in storage unit 608. In FIG. 14, the voltage headroom $\Delta V$ can be added to raise $V_{ref\_low}$. With such an arrangement, VREF ramp will not cross PIXEL_OUT voltage (and comparator 1102 will not trip) if PIXEL_OUT voltage is above the unmodified $V_{ref\_low}$ only due to the presence of dark current, and the likelihood of false tripping due to the presence of dark current can be reduced.

The timing of determination of the FLAG_2 signal can be adjusted to further mitigate the risk of false overflow charge detection. For example, as shown in FIG. 14B, FLAG_2 can be determined during the PD ADC phase after the residual charge is transferred from the photodiode PD to charge storage unit 608. As described above, in PD ADC phase, $V_{ref\_low}$ can represent the saturation threshold of photodiode PD beyond which the photodiode PD transfers overflow charge to charge storage unit 608. Comparing $V_{comp\_in}$ (which represents the quantity of residual charge in the photodiode PD) with $V_{ref\_low}$ in PD ADC can enable determining whether the photodiode PD reaches the saturation limit during the integration period. One advantage of performing the determination of whether the photodiode PD saturates based on the residual charge in the photodiode PD in the PD ADC mode, rather than the overflow charge in the FD ADC mode, can be that the photodiode PD is less susceptible to dark current. The residual charge stored in the photodiode typically contains a smaller dark current component than the overflow charge in the charge storage unit 608. Therefore, the risk of dark current causing incorrect overflow charge detection and assertion of the FLAG_2 signal can be reduced. In some examples, as shown in FIG. 14B, to further mitigate the effect of dark current, $V_{ref\_low}$ can be raised by a voltage headroom $\Delta V$ in PD ADC. With such an arrangement, VREF ramp will not cross PIXEL_OUT voltage (and comparator 1102 will not trip) if PIXEL_OUT voltage is above the unmodified $V_{ref\_low}$ only due to the presence of dark current, and the likelihood of false tripping due to the presence of dark current can be reduced.

In some examples, pixel cell 1100 can be configurable to switch between using the correlated double sampling operation of FIG. 12A (where two sampling operations are separated by the integration period) and the example measurement error compensation operation in FIG. 14A (where two sampling operations are performed after the integration period) for the FD ADC. The switching can be based on the duration of the integration period, which can be adaptable. For example, pixel cell 1100 can have an adaptive integration period, where the integration period can be increased when the pixel cell operates in an environment with low light intensity, and where the integration period can be reduced when the pixel cell operates in an environment with high or medium light intensity. With a reduced integration period, pixel cell 1100 can be controlled to perform the correlated double sampling operation of FIG. 12A, which allows complete elimination of reset noise from the FD ADC operation. With an increased integration period, pixel cell 1100 can be controlled to perform the measurement error compensation operation of FIG. 14A, which allows substantial reduction, if not complete elimination, of reset noise from the PD ADC operation.

Figure 15:
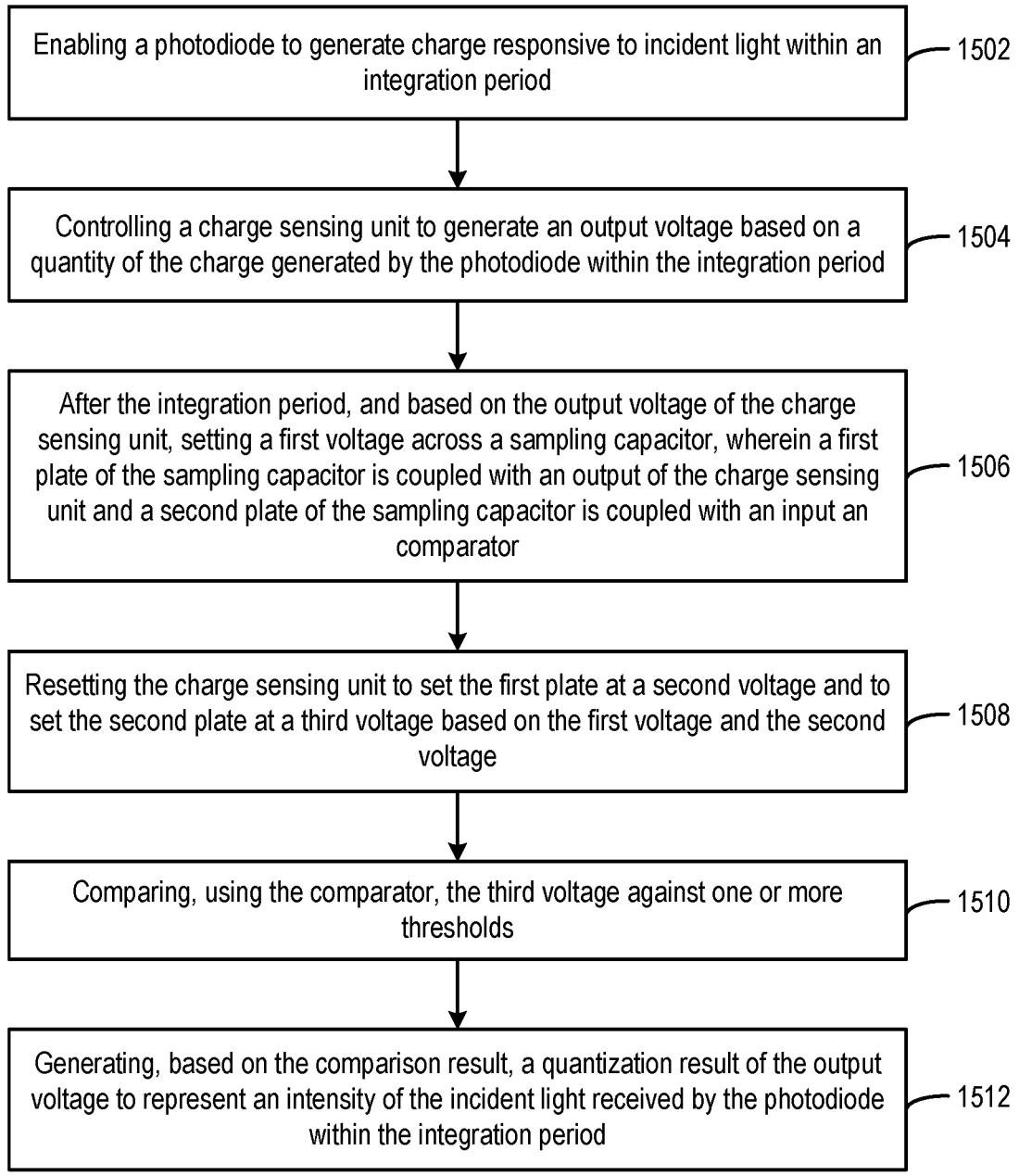
FIG. 15 illustrates a flowchart of an example process for measuring light intensity.

FIG. 15 illustrates a flowchart of a method 1500 of measuring light intensity. Method 1500 can be performed by, for example, various components of pixel cell 600/1100 including controller 1110.

In step 1502, controller 1110 can enable a photodiode (e.g., photodiode 602/PD) to generate charge responsive to incident light within an integration period. Controller 1110 can enable the photodiode to generate the charge based on, for example, disabling shutter switch 604/M0.

In step 1504, controller 1110 can control a charge sensing unit, such as charge sensing unit 608, to generate an output voltage based on a quantity of the charge generated by the photodiode within the integration period. Controller 1110 can control a bias voltage of transfer gate 606/M1 to allow charge to flow from the photodiode to a charge storage unit (e.g., charge storage unit 608a) of the charge sensing unit to develop an analog voltage, which can be buffered by buffer 608b of the charge sensing unit 608.

In step 1506, after the integration period ends, controller 1110 can set a first voltage across a sampling capacitor based on the output voltage of the charge sensing unit at the end of the end of the integration period. The sampling capacitor can include, for example, the CC capacitor of FIG. 11, and has a first plate coupled with an output of the charge sensing unit and a second plate coupled with an input an comparator (e.g., comparator 1102). The first voltage can be the voltage difference $V_{cc}$ described above and can be set based on resetting comparator 1102 by electrically connecting the input and output of the comparator together. Referring to Equation 12 above, the voltage difference $V_{cc}$ can include a component representing the charge transferred from the photodiode to charge storage unit 608a during the integration period ($V_{pixel\_out\_sig}$), a component representing the first reset noise charge ($V\sigma_{KTC1}$), and a component representing the comparator offset of comparator 1102 ($V_{comp\_offset}$).

In step 1508, controller 1110 can reset the charge sensing unit to set the first plate of the sampling capacitor at a second voltage and to set the second plate of the sampling capacitor at a third voltage based on the first voltage and the second voltage. In step 1508, controller 1110 can also control comparator 1102 to exit the reset state by disconnecting the input from the output of the comparator. As a result of resetting charge storage unit 608a (and charge sensing unit 608), the first plate of the sampling capacitor, coupled with the charge sensing unit output, can be set at a reset voltage $V_{pixel\_out\_rst}$. Moreover, second reset noise charge is also introduced into charge storage unit 608a, which can be represented by $V\sigma_{KTC2}$. The second reset noise charge may tracks the first reset noise charge. Via ac-coupling, the voltage of the second plate of the CC cap can track the first plate voltage but differ by the voltage difference $V_{cc}$. The voltage at the second plate of the CC cap (the third voltage) can be based on Equation 15 and include a noise component representing a combination of $V\sigma_{KTC1}$ and $V\sigma_{KTC2}$ of, respectively, the first reset noise and the second reset noise. In a case where the first reset noise and the second reset noise track each other and have the same polarity, the noise component can become smaller than either $V\sigma_{KTC1}$ or $V\sigma_{KTC2}$. As a result, the reset noise component can be reduced. Meanwhile, the comparator offset component $V_{comp\_offset}$ remains in the third voltage.

In step 1510, controller 1110 can use comparator 1102 to compare the third voltage against one or more thresholds. The comparison can be against a ramping threshold voltage (for FD ADC or PD ADC operation), or against a static threshold (for TTS operation). The comparator offset of comparator 1102 can be cancelled by the comparator offset component in the third voltage.

In step 1512, a quantization result of the output voltage can be generated based on the comparison result to represent an intensity of the incident light received by the photodiode within the integration period. A counter (e.g., counter 808) can generate count values periodically, and a memory (e.g., memory 810) can store a count value at the time when the comparator output trips. The count value stored in the memory can represent the quantization result.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
    a photodiode to generate charge responsive to incident light within an integration period;
    a charge sensing unit to store at least some of the charge and to generate an output voltage based on a quantity of the charge generated by the photodiode within the integration period; and
    an analog-to-digital converter (ADC) comprising:
        a comparator;
        a sampling capacitor having a first plate coupled with an output of the charge sensing unit and a second plate coupled with an input of the comparator; and
        a controller configured to, after the integration period:
            set a first voltage across the sampling capacitor based on the output voltage of the charge sensing unit;
            reset the charge sensing unit to set the first plate at a second voltage and to set the second plate at a third voltage based on the first voltage and the second voltage;
            compare, using the comparator, the third voltage against one or more thresholds; and
            generate, based on the comparison result, a quantization result of the output voltage to represent an intensity of the incident light received by the photodiode within the integration period.

2. The apparatus of claim 1, wherein the controller is configured to set the first voltage based on electrically connecting the input of the comparator with an output of the comparator; and
    wherein the first voltage includes:
        a first component representing a quantity of the charge generated by the photodiode within the integration period,
        a second component representing an offset of the comparator, and
        a third component representing first reset noise charge introduced to the charge sensing unit in a reset operation prior to the resetting the charge sensing unit;
    wherein the second voltage comprises a fourth component representing second reset noise charge introduced to the charge sensing unit by the resetting the charge sensing unit; and
    wherein the third voltage includes a fifth component representing a combination of the third component and the fourth component.

3. The apparatus of claim 2, wherein the third voltage includes the second component representing an offset of the comparator to cancel the offset of the comparator when the third voltage is compared against the one or more thresholds by the comparator.

4. The apparatus of claim 1, wherein the one or more thresholds comprise a ramping threshold; and
    wherein the ramping threshold comprises a range of thresholds based on an expected quantity of dark current in the charge sensing unit.

5. The apparatus of claim 1, wherein the ADC further comprises a counter and a memory;
    wherein the counter is configured to generate count values with respect to time; and
    wherein the memory is configured to, based on the comparison result, store a count value of the count values as the quantization result.

6. The apparatus of claim 5,
wherein the photodiode is configured to store residual charge until the photodiode saturates and to transmit overflow charge when the photodiode saturates.

7. The apparatus of claim 6, wherein the ADC is configured to:
determine, based on the comparison result, that the charge sensing unit stores the overflow charge from the photodiode within the integration period; and
based on the determination, assert a flag bit to maintain the stored count value in the memory as the quantization result.

8. The apparatus of claim 6,
wherein the quantization result is a first quantization result;
wherein the comparison result is a first comparison result; and
where the ADC is configured to:
obtain, using the sampling capacitor, a fourth voltage representing a quantity of overflow charge stored in the charge sensing unit during the integration period;
compare, using the comparator, the fourth voltage against a fixed threshold of the one or more thresholds to generate a second comparison result; and
generate, based on the second comparison result, a second quantization result of a duration for the fourth voltage to reach the fixed threshold to represent an intensity of the incident light received by the photodiode within the integration period.

9. The apparatus of claim 1, wherein the controller is configured to set the first voltage across the sampling capacitor and to reset the charge sensing unit to set the second plate at the third voltage based on the first voltage and the second voltage at the end of the integration period based on a duration of the integration period exceeding a duration threshold.

10. The apparatus of claim 1, wherein the photodiode, the charge sensing unit, and the ADC is part of a pixel cell; and
wherein the quantization result corresponds to a pixel value.

11. An analog-to-digital converter (ADC) comprising:
a comparator;
a sampling capacitor having a first plate coupled with an output of a charge sensing unit and a second plate being coupled with an input of the comparator; and
a controller configured to:
at a first time, set a first voltage across the sampling capacitor based on an output voltage of the charge sensing unit at the first time;
reset the charge sensing unit to set the first plate at a second voltage and to set the second plate at a third voltage based on the first voltage and the second voltage;
compare, using the comparator, the third voltage against one or more thresholds; and
generate, based on the comparison result, a quantization result of the output voltage of the charge sensing unit at the first time.

12. The ADC of claim 11,
wherein the controller is configured to set the first voltage based on electrically connecting the input of the comparator with an output of the comparator; and
wherein the first voltage includes:
a first component representing a quantity of charge stored in the charge sensing unit,
a second component representing an offset of the comparator, and
a third component representing first reset noise charge introduced to the charge sensing unit in a reset operation prior to the resetting the charge sensing unit;
wherein the second voltage comprises a fourth component representing second reset noise charge introduced to the charge sensing unit by the resetting the charge sensing unit; and
wherein the third voltage includes a fifth component representing a combination of the third component and the fourth component.

13. The ADC of claim 12, wherein the third voltage includes the second component representing the offset of the comparator to cancel the offset of the comparator when the third voltage is compared against the one or more thresholds by the comparator.

14. The ADC of claim 11, further comprising a counter and a memory;
wherein the counter is configured to generate count values with respect to time; and
wherein the memory is configured to store, based on comparison result, a count value of the count values as the quantization result.

15. The ADC of claim 11, wherein the one or more thresholds comprise a ramping threshold; and
wherein the ramping threshold comprises a range of thresholds set based on an expected quantity of dark current in the charge sensing unit.

16. The ADC of claim 11, wherein the charge sensing unit comprises a floating drain of a transistor configured to store charge.

17. The ADC of claim 11, wherein a voltage across the sampling capacitor drifts prior to the setting of the first voltage.

18. A method comprising:
enabling a photodiode to generate charge responsive to incident light within an integration period;
controlling a charge sensing unit to generate an output voltage based on a quantity of the charge generated by the photodiode within the integration period;
after the integration period, and based on the output voltage of the charge sensing unit, setting a first voltage across a sampling capacitor, wherein a first plate of the sampling capacitor is coupled with an output of the charge sensing unit and a second plate of the sampling capacitor is coupled with an input of an comparator;
resetting the charge sensing unit to set the first plate at a second voltage and to set the second plate at a third voltage based on the first voltage and the second voltage;
comparing, using the comparator, the third voltage against one or more thresholds; and
generating, based on the comparison result, a quantization result of the output voltage to represent an intensity of the incident light received by the photodiode within the integration period.

19. The method of claim 18, further comprising:
electrically connecting the input of the comparator with an output of the comparator to set the first voltage across the sampling capacitor;
wherein the first voltage includes:
a first component representing a quantity of charge stored in the charge sensing unit,
a second component representing an offset of the comparator, and a third component representing first reset noise charge introduced to the charge sensing unit in a reset operation prior to the resetting the charge sensing unit;

wherein the second voltage comprises a fourth component representing second reset noise charge introduced to the charge sensing unit by the resetting the charge sensing unit; and wherein the third voltage includes a fifth component representing a combination of the third component and the fourth component.

20. The method of claim 19, wherein the third voltage includes the second component representing the offset of the comparator to cancel the offset of the comparator when the third voltage is compared against the one or more thresholds by the comparator.

* * * * *